US012652816B2

(12) United States Patent
Han et al.

(10) Patent No.: US 12,652,816 B2
(45) Date of Patent: Jun. 9, 2026

(54) METHOD FOR FABRICATING SEMICONDUCTOR DEVICE

(71) Applicant: Samsung Electronics Co., Ltd., Suwon-si (KR)

(72) Inventors: Kyu-Hee Han, Suwon-si (KR); Bong Kwan Baek, Suwon-si (KR); Sang Shin Jang, Suwon-si (KR); Koung Min Ryu, Suwon-si (KR); Jong Min Baek, Suwon-si (KR); Jung Hoo Shin, Suwon-si (KR); Jun Hyuk Lim, Suwon-si (KR); Jung Hwan Chun, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 450 days.

(21) Appl. No.: 18/175,821

(22) Filed: Feb. 28, 2023

(65) Prior Publication Data

US 2023/0411498 A1     Dec. 21, 2023

(30) Foreign Application Priority Data

Jun. 17, 2022    (KR) ........................ 10-2022-0074038

(51) Int. Cl.
H10D 30/01 (2025.01)
H10D 84/01 (2025.01)
H10D 84/03 (2025.01)

(52) U.S. Cl.
CPC ......... H10D 30/024 (2025.01); H10D 84/013 (2025.01); H10D 84/0149 (2025.01); H10D 84/0158 (2025.01); H10D 84/038 (2025.01)

(58) Field of Classification Search
CPC ......... H01L 21/76802; H01L 21/76804; H01L 21/76843; H10D 84/013; H10D 30/6219;
(Continued)

(56) References Cited

U.S. PATENT DOCUMENTS 9,478,468 B1   10/2016   Cheng et al.
9,478,568 B2   10/2016   Aisu et al.
(Continued)

FOREIGN PATENT DOCUMENTS

KR          101098478 B1   12/2011
KR          20170100202 A    9/2017
KR          101950349 B1    2/2019

OTHER PUBLICATIONS

Notice of Allowance in Korean Appln. No. 10-2022-0074038, mailed on Feb. 25, 2026, 6 pages (with English translation).

*Primary Examiner* — Tuan A Hoang

(74) *Attorney, Agent, or Firm* — Fish & Richardson P.C.

(57) ABSTRACT

A method for fabricating semiconductor device may include forming a source/drain pattern on a fin-type pattern, forming an etch stop film and an interlayer insulating film on the source/drain pattern, forming a contact hole in the interlayer insulating film, forming a sacrificial liner along a sidewall and a bottom surface of the contact hole, performing an ion implantation process while the sacrificial liner is present, removing the sacrificial liner and forming a contact liner along the sidewall of the contact hole, and forming a source/drain contact on the contact liner. The ion implantation process may include implant impurities into the source/drain pattern. The source/drain contact may be connected to the source/drain pattern.

20 Claims, 32 Drawing Sheets

(58) Field of Classification Search
CPC ............. H10D 84/0149; H10D 84/017; H10D
84/0186
See application file for complete search history.

(56) References Cited

U.S. PATENT DOCUMENTS

| 10,283,406 | B2 | 5/2019 | Basker et al. | |
| 10,566,246 | B1 | 2/2020 | Wu et al. | |
| 10,923,565 | B2 | 2/2021 | Lee et al. | |
| 2016/0104673 | A1* | 4/2016 | Tung | H10D 84/038 |
| | | | | 257/288 |
| 2021/0398813 | A1 | 12/2021 | Shen et al. | |
| 2023/0009077 | A1* | 1/2023 | Liang | H10D 62/118 |
| 2023/0343699 | A1* | 10/2023 | Lu | H10D 84/017 |

* cited by examiner

METHOD FOR FABRICATING SEMICONDUCTOR DEVICE

CROSS-REFERENCE TO RELATED APPLICATION

This application claims priority from Korean Patent Application No. 10-2022-0074038 filed on Jun. 17, 2022 in the Korean Intellectual Property Office, and all the benefits accruing therefrom under 35 U.S.C. 119, the entire contents of which are herein incorporated by reference.

BACKGROUND

1. Technical Field

The present disclosure relates to a method for fabricating a semiconductor device.

2. Description of Related Art

As one of the scaling technologies to increase the density of semiconductor devices, a multi-gate transistor has been proposed that forms a fin or nanowire-shaped multi-channel active pattern (or a silicon body) on a substrate and forms a gate on a surface of the multi-channel active pattern.

Since the multi-gate transistor uses a three-dimensional channel, it can easily perform scaling. In addition, the current control capability may be improved without increasing the length of a gate of the multi-gate transistor. Furthermore, it is possible to effectively restrain a short channel effect (SCE) through which a potential of a channel region is affected by a drain voltage.

Meanwhile, with a decrease in the pitch size of the semiconductor device, there may be a need to investigate ways to reduce capacitance and secure electrical stability between contacts in the semiconductor device.

SUMMARY

The present disclosure provides a method for fabricating a semiconductor device that can improve device performance and reliability.

Technical aspects of the present disclosure are not restricted to those set forth herein, and other unmentioned technical aspects will be clearly understood by one of ordinary skill in the art to which the present disclosure pertains by referring to the detailed description of the present disclosure given below.

According to an embodiment, a method for fabricating a semiconductor device may include forming a source/drain pattern on a fin-type pattern; forming an etch stop film and an interlayer insulating film on the source/drain pattern; forming a contact hole in the interlayer insulating film; forming a sacrificial liner along a sidewall and a bottom surface of the contact hole; performing an ion implantation process while the sacrificial liner is present, the ion implantation process including implanting impurities into the source/drain pattern; removing the sacrificial liner and forming a contact liner along the sidewall of the contact hole; and forming a source/drain contact on the contact liner. The source/drain contact may be connected to the source/drain pattern.

According to an embodiment, a method for fabricating a semiconductor device may include forming a source/drain pattern on a fin-type pattern; forming an etch stop film and an interlayer insulating film on the source/drain pattern;

forming a contact hole in the interlayer insulating film; forming a sacrificial liner along a sidewall and a bottom surface of the contact hole; forming an impurity region in the source/drain pattern, the forming the impurity region being performed while the sacrificial liner is present; removing the sacrificial liner and forming a contact liner along the sidewall of the contact hole, the contact liner including silicon, oxygen and carbon; and forming a source/drain contact on the contact liner, the source/drain contact being connected to the source/drain pattern.

According to an embodiment, a method for fabricating a semiconductor device, may include forming a fin-type pattern and an upper pattern structure on a substrate, the upper pattern structure including a plurality of sacrificial patterns and a plurality of active patterns alternately stacked on each other; forming a source/drain pattern in the upper pattern structure; forming an etch stop film and an interlayer insulating film on the source/drain pattern; forming a sheet pattern connected to the source/drain pattern, the forming the sheet pattern including removing the sacrificial pattern; after the forming the sheet pattern, forming a contact hole in the interlayer insulating film; forming a sacrificial liner along a sidewall and a bottom surface of the contact hole; performing an ion implantation process while the sacrificial liner is present; removing the sacrificial liner and forming a pre-contact liner along the sidewall and the bottom surface of the contact hole, the pre-contact liner including a SiOC film; forming a contact liner along the sidewall of the contact hole, the forming the contact liner including removing a portion of the etch stop film and the pre-contact liner; and forming a source/drain contact on the contact liner, the source/drain contact being connected to the source/drain pattern. The ion implantation process may include implanting impurities into the source/drain pattern

BRIEF DESCRIPTION OF THE DRAWINGS

The above and other aspects and features of the present disclosure will become more apparent by describing in detail example embodiments thereof with reference to the attached drawings, in which:

FIGS. 1 to 17 are intermediate step diagrams describing a method of fabricating a semiconductor device according to some embodiments;

DETAILED DESCRIPTION OF THE EMBODIMENTS

Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Hereinafter, embodiments of the present disclosure will be described with reference to the attached drawings:

While the drawings of a semiconductor device according to some embodiments illustrate, for example, a finFET transistor including a channel region with a fin-type pattern, a transistor including a nano-wire or a nano-sheet, a multi-bridge channel field effect transistor (MBCFET™), or a vertical transistor, the present disclosure is not limited thereto. The semiconductor device according to some embodiments can include a tunneling transistor (tunneling FET) or a three-dimensional (3D) transistor. The semiconductor device according to some embodiments could include a planar transistor. Furthermore, technical ideas of the present disclosure may be applied to transistors (2D material-based FETs) based on a two-dimensional material and the heterostructures thereof.

In addition, the semiconductor device according to some embodiments may include a bipolar junction transistor and a lateral double diffused transistor (LDMOS).

A method of fabricating a semiconductor device according to some embodiments will be described with reference to FIGS. 1 to 22.

Figure 18:
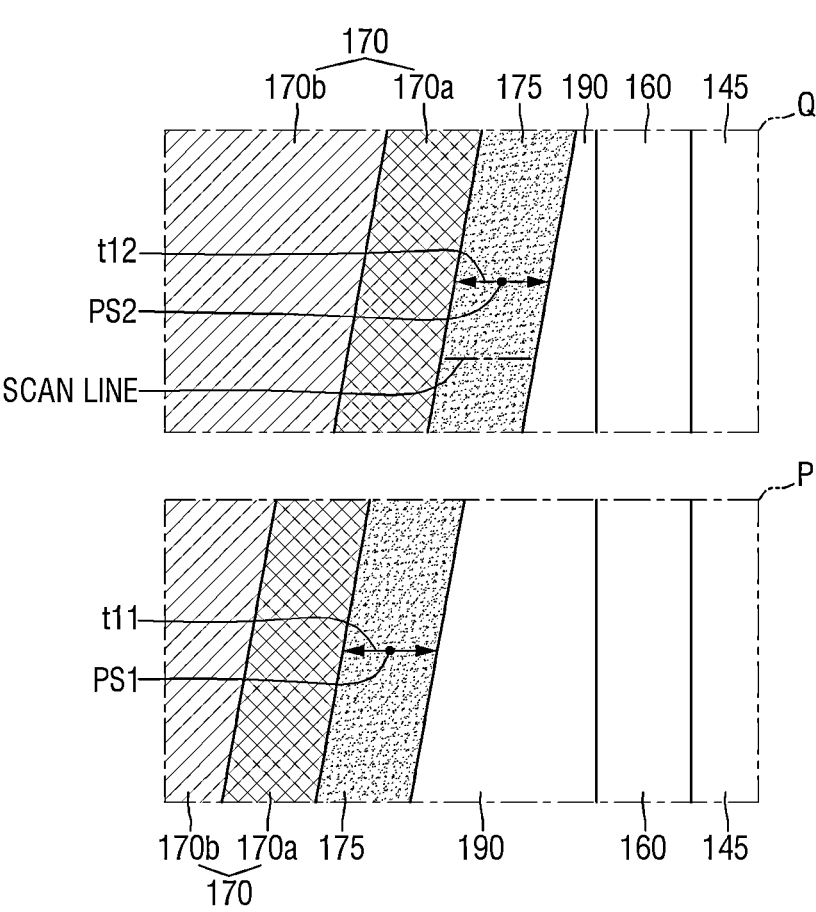
FIG. 18 is an enlarged view illustrating part P and part Q in FIG. 17.
Figure 19:
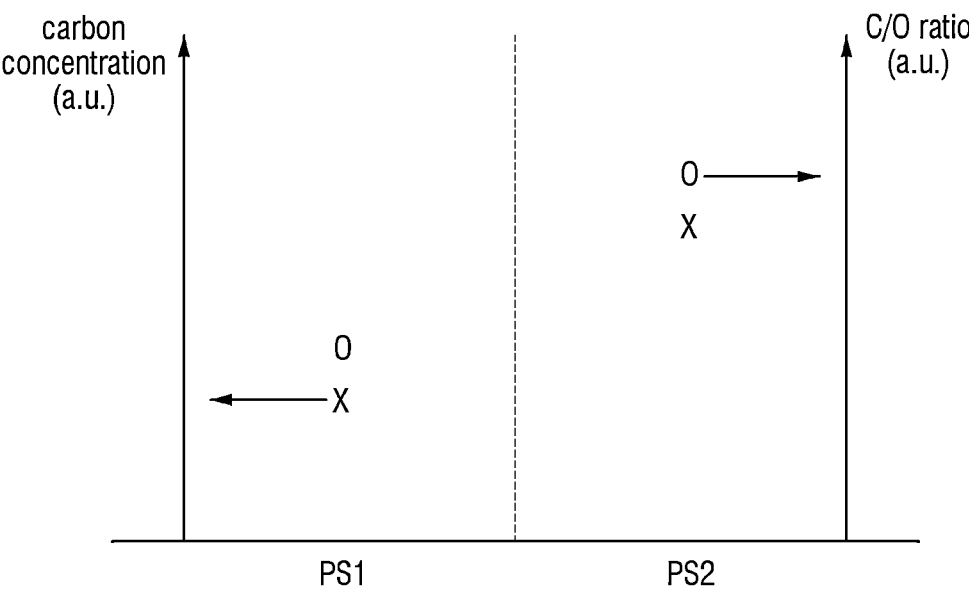
FIGS. 19 and 20 are graphs illustrating a carbon concentration and a ratio of carbon to oxygen at a first point PS1 and a second point PS2 of FIG. 17, respectively.
Figure 20:
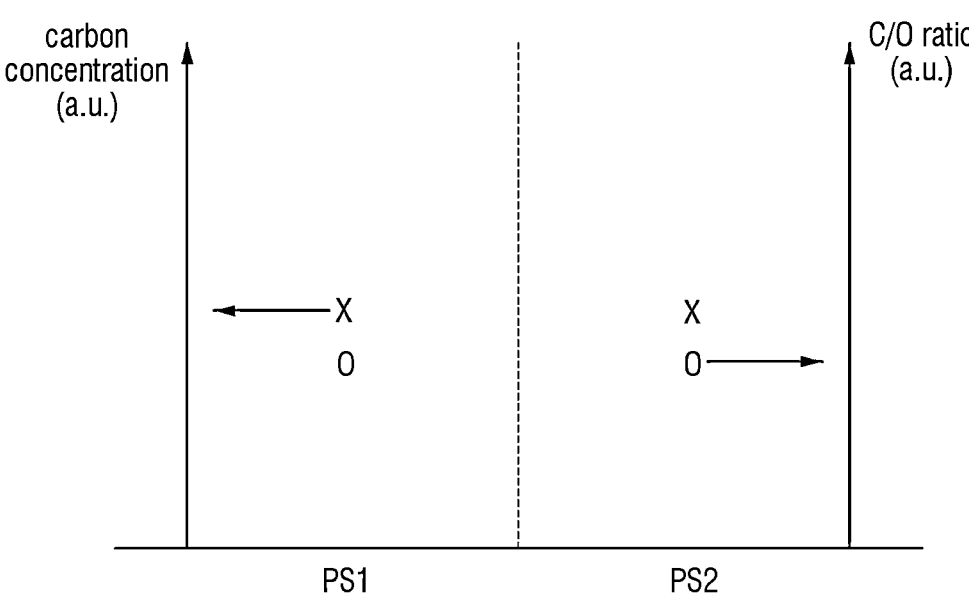
Figure 21:
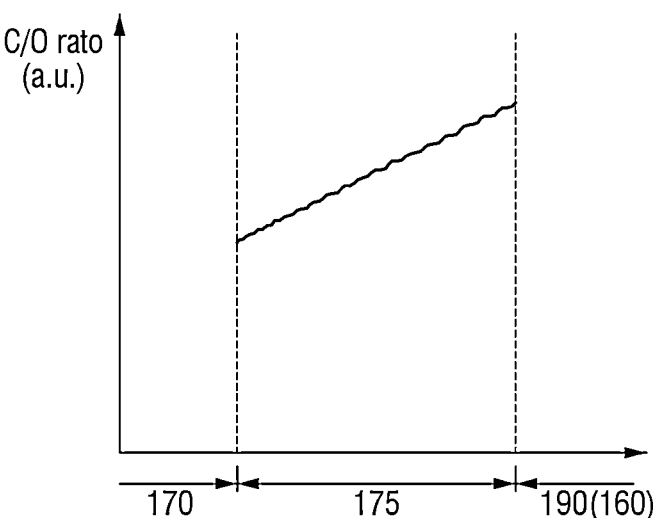
FIGS. 21 and 22 are graphs schematically illustrating the ratio of carbon to oxygen along a SCAN LINE in FIG. 18, respectively.
Figure 22:
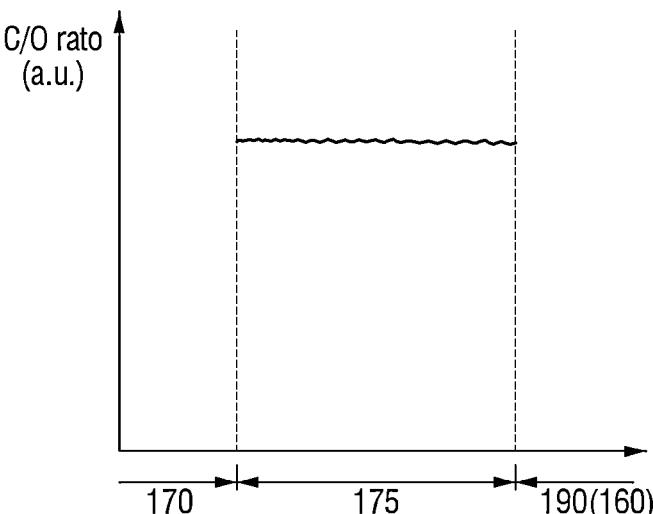

FIGS. 1 to 17 are intermediate step diagrams describing a method of fabricating a semiconductor device according to some embodiments. FIG. 18 is an enlarged view illustrating part P and part Q in FIG. 17. FIGS. 19 and 20 are graphs illustrating a carbon concentration and a ratio of carbon to oxygen at a first point PS1 and a second point PS2 of FIG. 17, respectively. FIGS. 21 and 22 are graphs schematically illustrating the ratio of carbon to oxygen along a SCAN LINE in FIG. 18, respectively.

Figure 1:
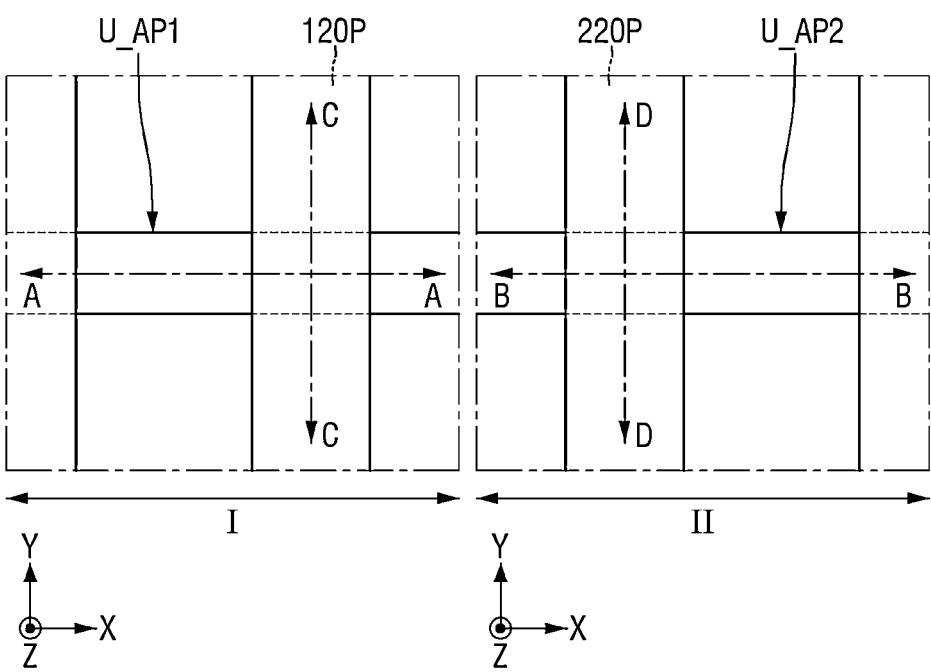

FIGS. 2 and 4 to 17 are cross-sectional views taken along lines A-A and B-B of FIG. 1, respectively. FIG. 3 is a cross-sectional view taken along lines C-C and D-D of FIG. 1.

Figure 2:
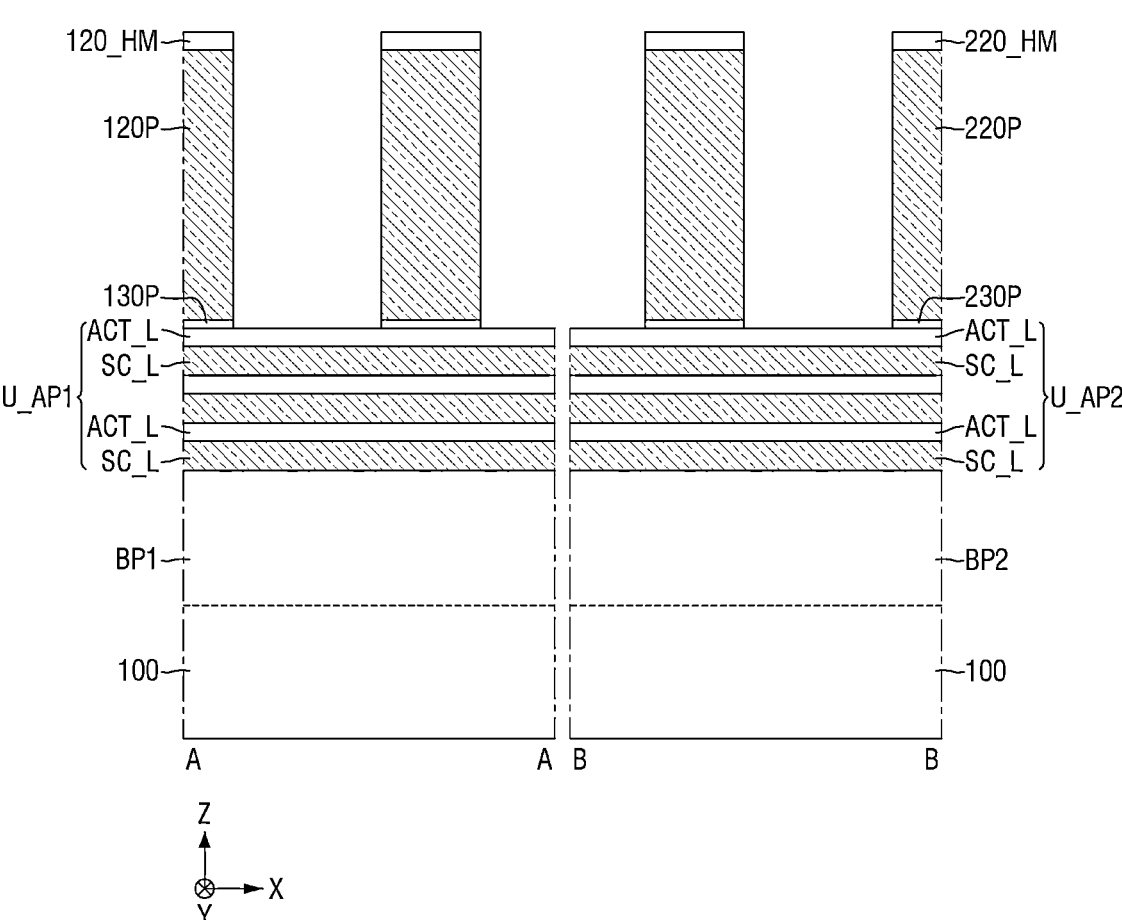
Figure 3:
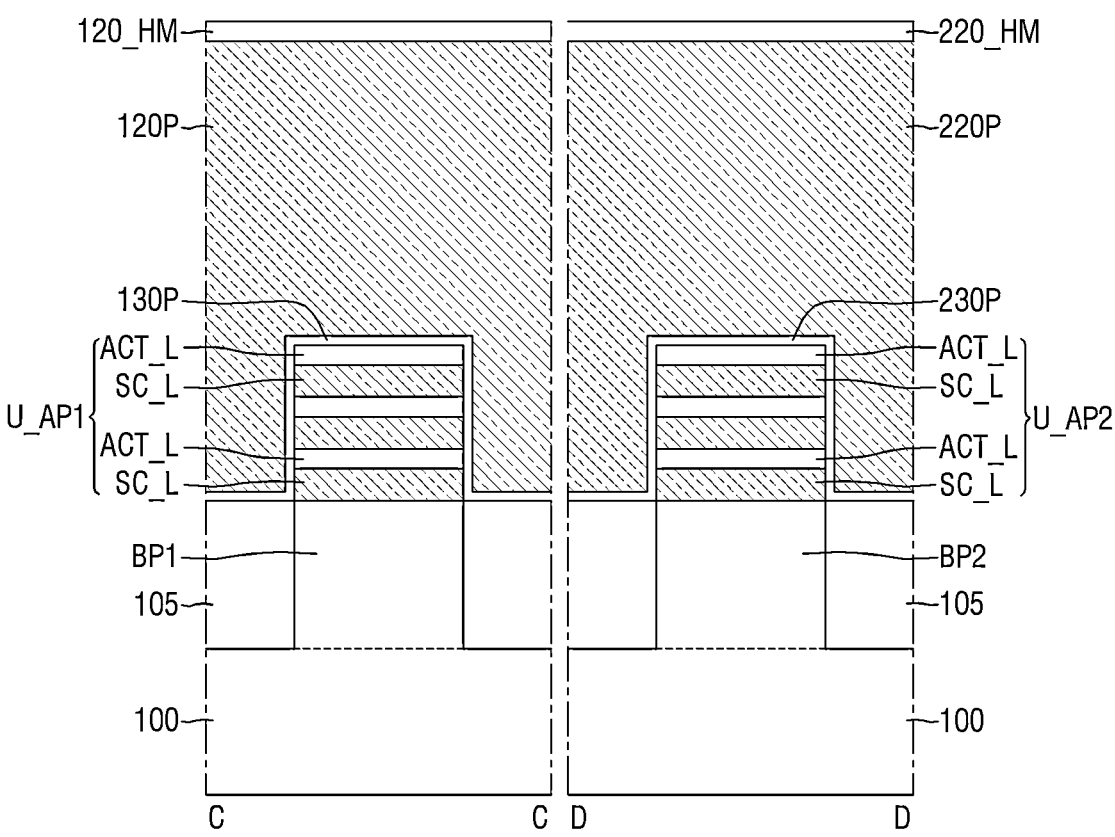

Referring to FIGS. 1-2, a first fin-type pattern BP1 and a first upper pattern structure U_AP1, and a second fin-type pattern BP2 and a second upper pattern structure U_AP2 may be formed on a substrate 100.

The substrate 100 may include a first region I and a second region II. The first region I may be an NMOS region, and the second region II may be a PMOS region.

The substrate 100 may be a bulk silicon or a silicon-on-insulator (SOI). Alternatively, the substrate 100 may be a silicon substrate or another material, and may include, for example, silicon germanium, silicon germanium on insulator (SGOI), indium antimonide, lead tellurium compound, indium arsenide, indium phosphide, gallium arsenide, or gallium antimonide, but the present disclosure is not limited thereto.

The first fin-type pattern BP1 and the first upper pattern structure U_AP1 may be formed in the first region I of the substrate 100. A second fin-type pattern BP2 and a second upper pattern structure U_AP2 may be formed in the second region II of the substrate 100.

Each of the first fin-type pattern BP1 and the second fin-type pattern BP2 may protrude from the substrate 100. Each of the first fin-type pattern BP1 and the second fin-type pattern BP2 may extend long in a first direction X.

The first upper pattern structure U_AP1 may be disposed on the first fin-type pattern BP1. The second upper pattern structure U_AP2 may be disposed on the second fin-type pattern BP2.

Each of the first upper pattern structure U_AP1 and the second upper pattern structure U_AP2 may extend in the first direction X. Each of the first upper pattern structure U_AP1 and the second upper pattern structure U_AP2 may include a plurality of sacrificial patterns SC_L and a plurality of active patterns ACT_L, which may be alternately stacked. Although each of the first upper pattern structure U_AP1 and the second upper pattern structure U_AP2 are illustrated to include three sacrificial patterns SC_L and three active patterns ACT_L, the present disclosure is not limited thereto. The active pattern ACT_L may be a portion used as a channel region of the transistor.

The first fin-type pattern BP1 and the second fin-type pattern BP2 may be formed by partially etching the substrate 100, or may include an epitaxial layer grown from the substrate 100. The first fin-type pattern BP1 and the second fin-type pattern BP2 may include silicon or germanium, which is an elemental semiconductor material. In addition, the first fin-type pattern BP1 and the second fin-type pattern BP2 may include a compound semiconductor, for example, a group IV-IV compound semiconductor or a group III-V compound semiconductor.

The group IV-IV compound semiconductor may be, for example, a binary compound including at least two of carbon (C), silicon (Si), germanium (Ge) and tin (Sn), a ternary compound, or a compound in which they are doped with a group IV element.

The group III-V compound semiconductor may be, for example, one of a binary compound, a ternary compound, or a tetravalent compound formed by combining at least one of aluminum (Al), gallium (Ga) and indium (In) as a group III element with one of phosphorus (P), arsenic (As) and antimony (Sb) as a group V element.

Each of the sacrificial pattern SC_L and the active pattern ACT_L may include one of silicon or germanium which is an elemental semiconductor material, respectively, the group IV-IV compound semiconductor, and the group III-V compound semiconductor. The sacrificial pattern SC_L may include a material with an etch selectivity with respect to the active pattern ACT_L. The sacrificial pattern SC_L may include a material with an etch selectivity with respect to the first fin-type pattern BP1 and the second fin-type pattern BP2.

In the following description, the first fin-type pattern BP1 and the second fin-type pattern BP2 may be a silicon fin-type pattern including silicon. The sacrificial pattern SC_L may be a silicon-germanium pattern including silicon-germanium. The active pattern ACT_L may be a silicon pattern including silicon.

Referring to FIG. 3, a field insulating film 105 may be formed on the substrate 100. The field insulating film 105 may cover a sidewall of the first fin-type pattern BP1 and a sidewall of the second fin-type pattern BP2. The field insulating film 105 is illustrated to cover the entire sidewall of the first fin-type pattern BP1 and the entire sidewall of the second fin-type pattern BP2, but the present disclosure is not limited thereto.

The field insulating film 105 may not cover a sidewall of the first upper pattern structure U_AP1 and a sidewall of the second upper pattern structure U_AP2. The first upper pattern structure U_AP1 and the second upper pattern structure U_AP2 may protrude in a third direction Z, rather than an upper surface of the field insulating film 105.

The field insulating film 105 may include, for example, an oxide film, a nitride film, an oxynitride film, or the combination film thereof. Although the field insulating film 105 is illustrated as a single film, this is done for convenience of description, and the present disclosure is not limited thereto.

In addition, referring to FIGS. 2 and 3, a first dummy gate insulating film 130P, a first dummy gate electrode 120P, and a first dummy gate capping film 120_HM may be formed on the first upper pattern structure U_AP1. The first dummy gate electrode 120P may intersect the first upper pattern structure U_AP1.

A second dummy gate insulating film 230P, a second dummy gate electrode 220P, and a second dummy gate capping film 220_HM may be formed on the second upper pattern structure U_AP2. The second dummy gate electrode 220P may intersect the second upper pattern structure U_AP2.

Each of the first dummy gate electrode 120P and the second dummy gate electrode 220P may extend in a second direction Y. The adjacent first dummy gate electrodes 120P may be spaced apart from each other in the first direction X. The adjacent second dummy gate electrodes 220P may be spaced apart from each other in the first direction X.

The first dummy gate insulating film 130P is formed between the first dummy gate electrode 120P and the first upper pattern structure U_AP1. The first dummy gate insulating film 130P is formed along the upper surface of the field insulating film 105 and a sidewall and an upper surface of the first upper pattern structure U_AP1.

The second dummy gate insulating film 230P is formed between the second dummy gate electrode 220P and the second upper pattern structure U_AP2. The second dummy gate insulating film 230P is formed along the upper surface of the field insulating film 105 and a sidewall and an upper surface of the second upper pattern structure U_AP2.

The first dummy gate capping film 120_HM is formed on the first dummy gate electrode 120P. The second dummy gate capping film 220_HM is formed on the second dummy gate electrode 220P.

The first dummy gate insulating film 130P and a second dummy gate insulating film 230P may include, for example, silicon oxide, but the present disclosure is not limited thereto. The first dummy gate electrode 120P and the second dummy gate electrode 220P may include, for example, polysilicon, but the present disclosure is not limited thereto. A first dummy gate capping film 120_HM and a second dummy gate capping film 220_HM may include, for example, silicon nitride, but the present disclosure is not limited thereto.

Figure 4:
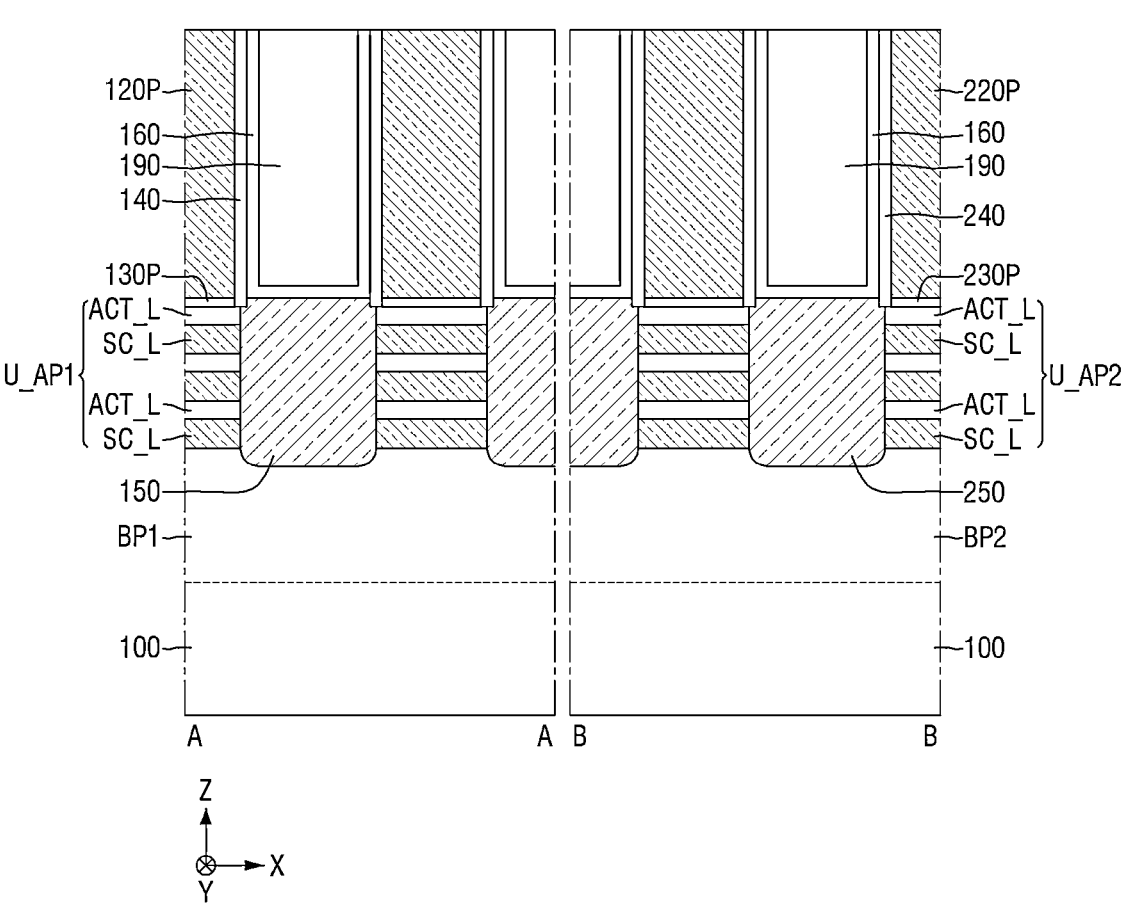

Referring to FIG. 4, a first gate spacer 140 may be formed on a sidewall of the first dummy gate electrode 120P.

A first source/drain pattern 150 may be formed on the first fin-type pattern BP1. The first source/drain pattern 150 may be formed in the first upper pattern structure U_AP1.

Unlike the illustrated configuration, before forming the first source/drain pattern 150, an inner spacer may be formed between the active patterns ACT_L adjacent to each other in the third direction Z.

In addition, a second gate spacer 240 may be formed on a sidewall of the second dummy gate electrode 220P. A second source/drain pattern 250 is formed on the second fin-type pattern BP2. The second source/drain pattern 250 may be formed in the second upper pattern structure U_AP2.

Each of the first gate spacer 140 and the second gate spacer 240 may include, for example, at least one of silicon nitride (SiN), silicon oxynitride (SiON), silicon oxide (SiO$_2$), silicon oxycarbon nitride (SiOCN), silicon boron nitride (SiBN), silicon oxyboron nitride (SiOBN), silicon oxycarbide (SiOC), and a combination thereof. Although the first gate spacer 140 and the second gate spacer 240 are illustrated as single films, this is done for convenience of description, and the present disclosure is not limited thereto.

The first source/drain pattern 150 and the second source/drain pattern 250 include a semiconductor material. The first source/drain pattern 150 may be a semiconductor pattern doped with n-type impurities. The second source/drain pattern 250 may be a semiconductor pattern doped with p-type impurities.

Unlike the configuration described above, after forming the second source/drain pattern 250, the first source/drain pattern 150 may be formed.

In addition, a source/drain etch stop film 160 and an interlayer insulating film 190 may be formed on the first source/drain pattern 150 and the second source/drain pattern 250.

While forming the source/drain etch stop film 160 and the interlayer insulating film 190, the first dummy gate capping film 120_HM and the second dummy gate capping film 220_HM may be removed. Accordingly, the first dummy gate electrode 120P and the second dummy gate electrode 220P may be exposed.

The source/drain etch stop film 160 may include a material with an etch selectivity with regard to the interlayer insulating film 190. The source/drain etch stop film 160 may include, for example, at least one of silicon nitride (SiN), silicon oxynitride (SiON), silicon oxycarbon nitride (SiOCN), silicon boron nitride (SiBN), silicon oxyboron nitride (SiOBN), silicon oxycarbide (SiOC), and a combination thereof.

The interlayer insulating film 190 may include, for example, at least one of silicon oxide, silicon nitride, a silicon oxynitride, and a low dielectric constant material. The low dielectric constant material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), Tonen SilaZen (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but the present disclosure is not limited thereto.

Figure 5:
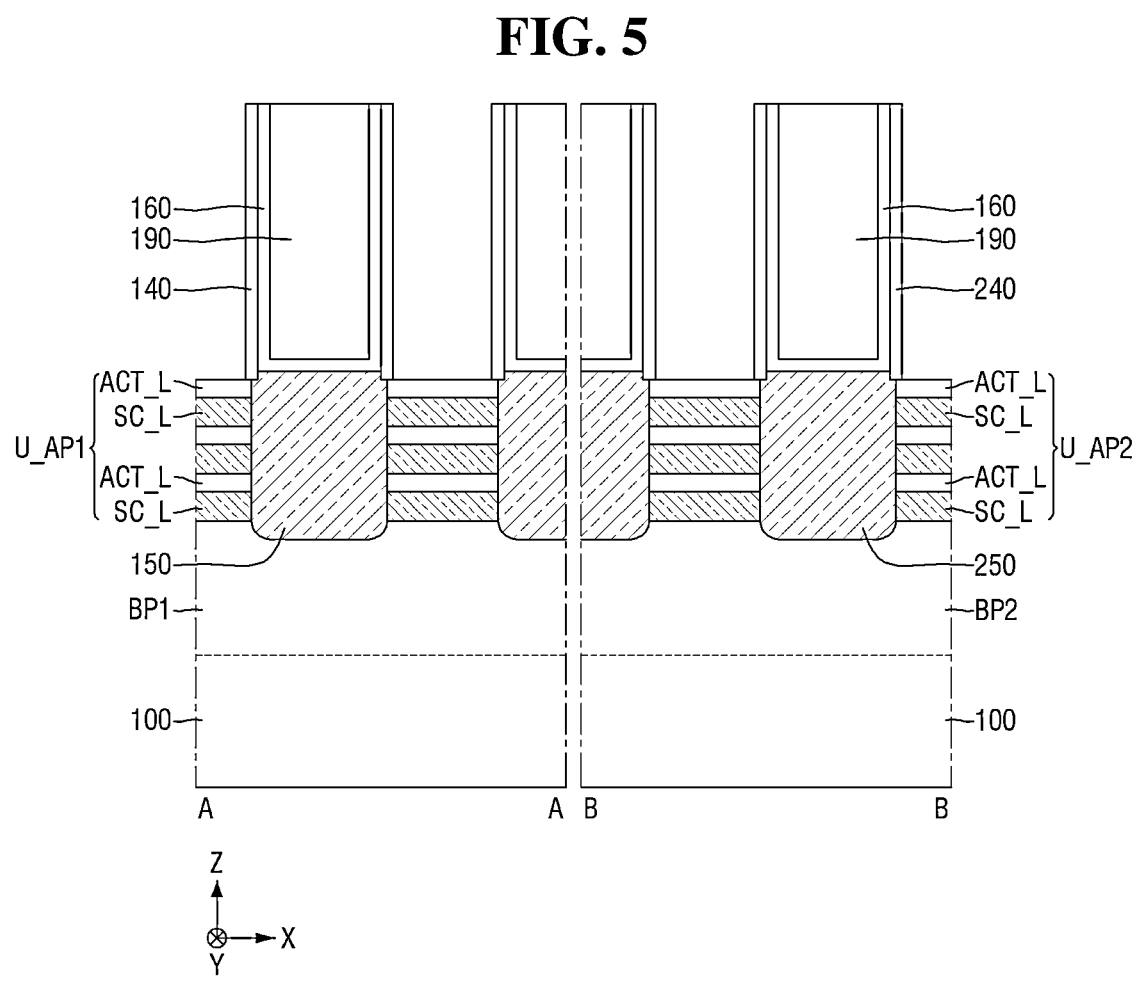

Referring to FIG. 5, the first dummy gate insulating film 130P and the first dummy gate electrode 120P may be removed to expose the first upper pattern structure U_AP1 between the first gate spacers 140.

The second dummy gate insulating film 230P and the second dummy gate electrode 220P may be removed to expose the second upper pattern structure U_AP2 between the second gate spacers 240.

The first dummy gate electrode 120P may be removed simultaneously with the second dummy gate electrode 220P. The first dummy gate insulating film 130P may be removed simultaneously with the second dummy gate insulating film 230P.

Figure 6:
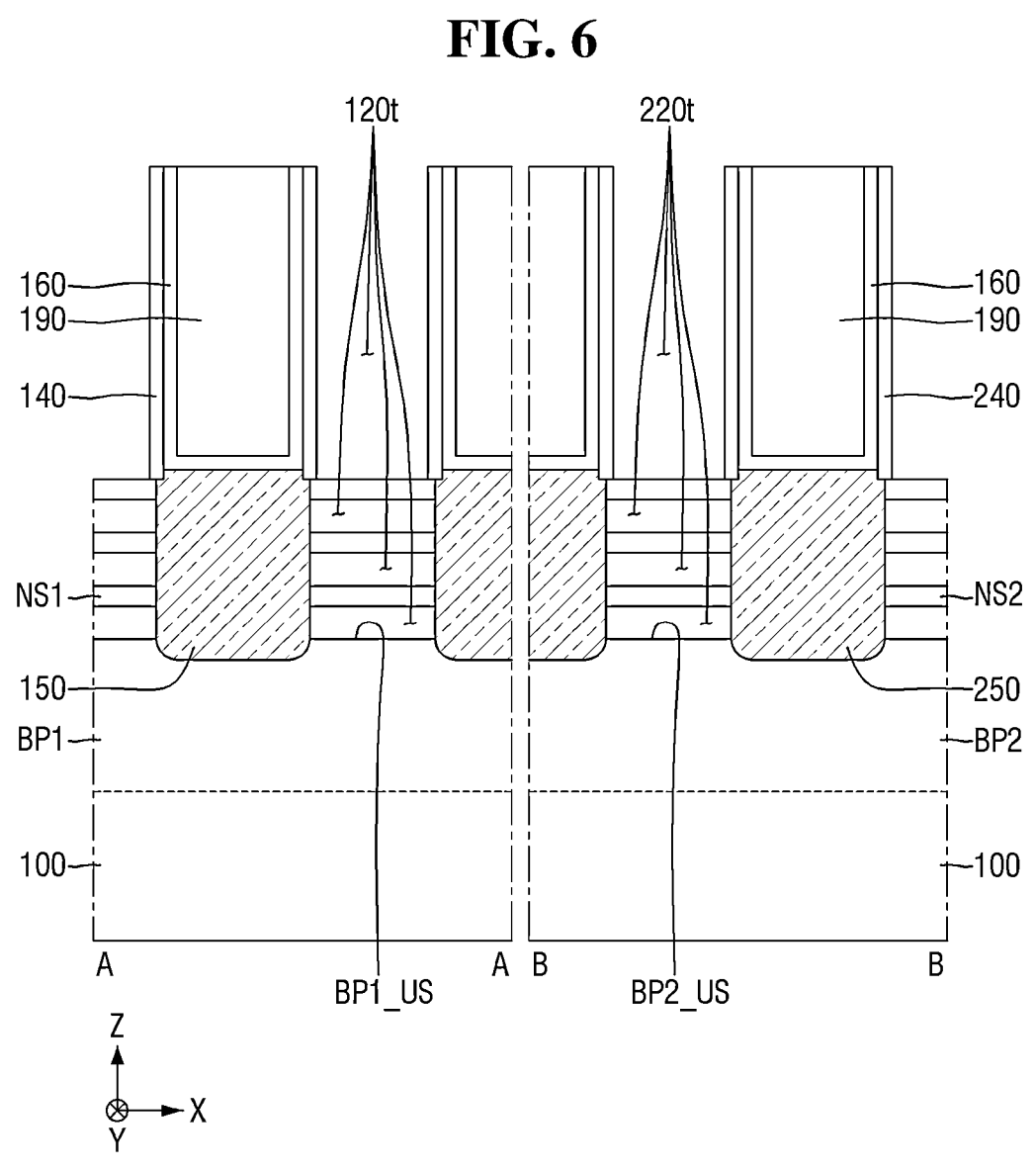

Referring to FIG. 6, a first sheet pattern NS1 and a second sheet pattern NS2 may be formed by removing the sacrificial pattern SC_L.

A plurality of first sheet patterns NS1 may be formed on an upper surface BP1_US of the first fin-type pattern. Each of the first sheet patterns NS1 may be spaced apart from each other in the third direction Z. The first sheet pattern NS1 may be connected to the first source/drain pattern 150. The sacrificial pattern SC_L may be removed so that a first gate trench 120*t* may be formed between the first gate spacers 140.

A plurality of second sheet patterns NS2 may be formed on an upper surface BP2 US of the second fin-type pattern. Each of the second sheet patterns NS2 may be spaced apart from each other in the third direction Z. The second sheet pattern NS2 may be connected to the second source/drain pattern 250. The sacrificial pattern SC_L may be removed so that a second gate trench 220*t* may be formed between the second gate spacers 240.

Figure 7:
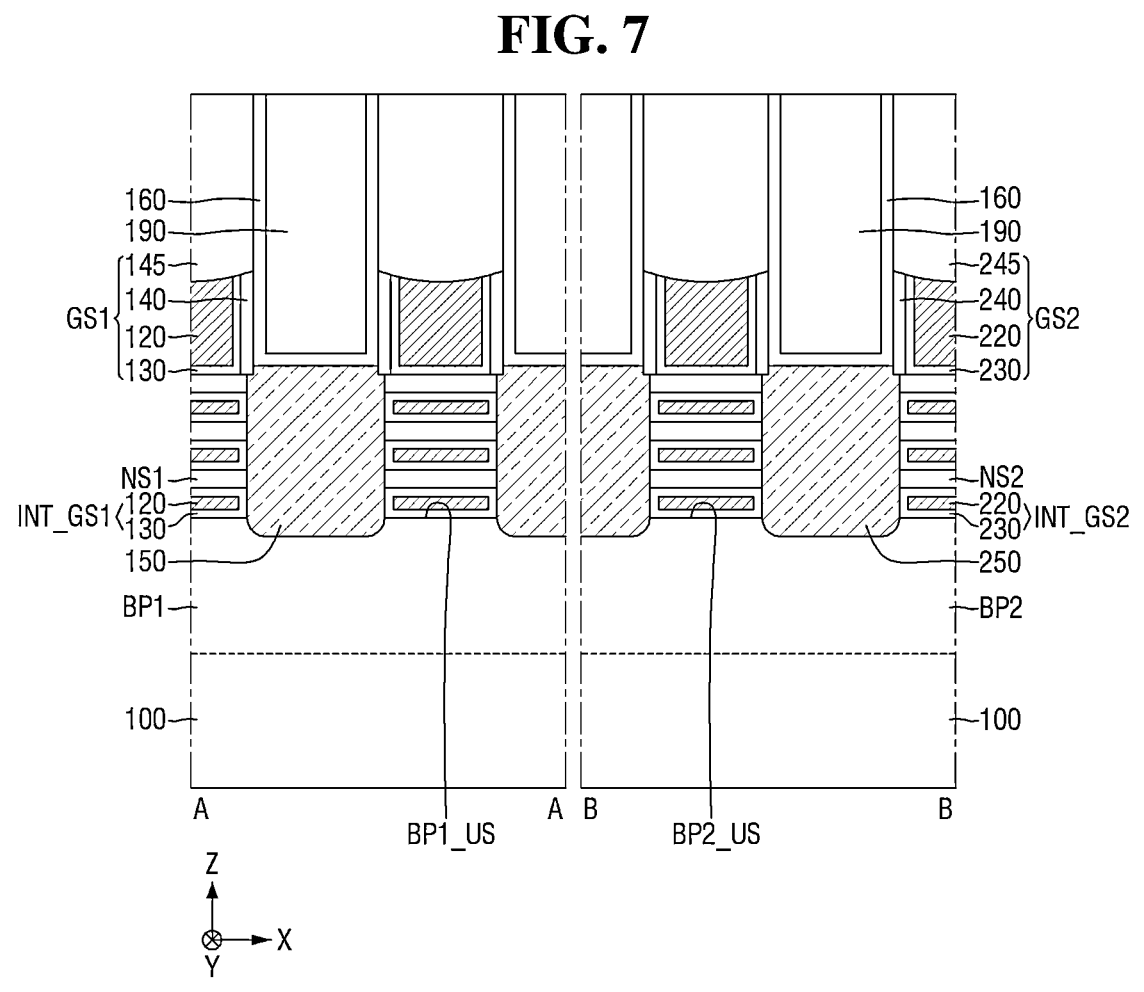

Referring to FIG. 7, a first gate electrode 120 and a first gate insulating film 130 may be formed in the first gate trench 120*t*.

A second gate electrode 220 and a second gate insulating film 230 may be formed in the second gate trench 220*t*.

After forming the first gate electrode 120 and the second gate electrode 220, part of the first gate electrode 120 and part of the second gate electrode 220 may be removed. While removing part of the first gate electrode 120 and part of the second gate electrode 220, part of the first gate insulating film 130 and part of the second gate insulating film 230 may also be removed. Furthermore, while removing part of the first gate electrode 120 and part of the second gate electrode 220, part of the first gate spacer 140 and part of the second gate spacer 240 may be removed.

In addition, a first gate capping pattern 145 may be formed on the first gate electrode 120 and the first gate spacer 140. A second gate capping pattern 245 may be formed on the second gate electrode 220 and the second gate spacer 240. The first gate capping pattern 145 and the second gate capping pattern 245 may cover an upper surface of the first gate spacer 140 and an upper surface of the second gate spacer 240.

Unlike the illustrated configuration, while removing part of the first gate electrode 120 and part of the second gate electrode 220, the first gate spacer 140 and the second gate spacer 240 may not be removed. In this case, the first gate capping pattern 145 and the second gate capping pattern 245 may fail to cover the upper surface of the first gate spacer 140 and the upper surface of the second gate spacer 240.

An upper surface of the first gate capping pattern 145 and an upper surface of the second gate capping pattern 245 may be disposed on the same plane as an upper surface of the interlayer insulating film 190, but the present disclosure is not limited thereto.

A first gate structure GS1 may be formed on the first fin-type pattern BP1. The first gate structure GS1 may include the first gate electrode 120, the first gate insulating film 130, the first gate spacer 140, and the first gate capping pattern 145. The first gate structure GS1 may include a first inner gate structure INT_GS1. The first inner gate structure INT_GS1 may be formed between the first fin-type pattern BP1 and the first sheet pattern NS1 and between the first sheet patterns NS1 adjacent to each other in the third direction Z. The first inner gate structure INT_GS1 may include the first gate insulating film 130 and the first gate electrode 120, which may be disposed between the first fin-type pattern BP1 and the first sheet pattern NS1 and between the first sheet patterns NS1 adjacent to each other in the third direction Z.

A second gate structure GS2 may be formed on the second fin-type pattern BP2. The second gate structure GS2 may include the second gate electrode 220, the second gate insulating film 230, the second gate spacer 240, and the second gate capping pattern 245. The second gate structure GS2 may include a second inner gate structure INT_GS2. The second inner gate structure INT_GS2 may be formed between the second fin-type pattern BP2 and the second sheet pattern NS2 and between the second sheet patterns NS2 adjacent to each other in the third direction Z. The second inner gate structure INT_GS2 may include the second gate insulating film 230 and the second gate electrode 220, which may be disposed between the second fin-type pattern BP2 and the second sheet pattern NS2 and between the second sheet patterns NS2 adjacent to each other in the third direction Z.

Each of the first gate electrode 120 and the second gate electrode 220 may include titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbide (TiAlC—N), titanium aluminum carbide (TiAlC), titanium carbide (TiC), tantalum carbon nitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof.

Each of the first gate electrode 120 and the second gate electrode 220 may include a conductive metal oxide, a conductive metal oxynitride, or similar as well as a form in which the above-described material may be oxidized.

The first gate capping pattern 145 and the second gate capping pattern 245 may include, for example, at least one of silicon nitride (SiN), silicon oxynitride (SiON), silicon oxide (SiO₂), silicon carbon nitride (SiCN), silicon oxycarbon nitride (SiOCN), and a combination thereof.

The first gate insulating film 130 and the second gate insulating film 230 may include silicon oxide, silicon oxynitride, silicon nitride, or a high dielectric constant material with a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although the first gate insulating film 130 and the second gate insulating film 230 are illustrated as single films, this is done only for convenience of description, but the present disclosure is not limited thereto.

The method of fabricating a semiconductor device according to some embodiments may include fabricating a negative capacity (NC) FET using a negative capacitor. For example, the first gate insulating film 130 and the second gate insulating film 230 may include a ferroelectric material film with ferroelectric characteristics and a paraelectric material film with paraelectric characteristics.

The ferroelectric material film may have a negative capacitance, and the paraelectric material film may have a positive capacitance. For example, when two or more capacitors are connected in series and the capacitance of each capacitor has a positive value, the overall capacitance will be lower than the capacitance of each individual capacitor. On the other hand, when at least one of the capacitances of two or more capacitors connected in series has a negative value, the overall capacitance may have a positive value and may be greater than an absolute value of each individual capacitance.

When the ferroelectric material film with a negative capacitance and the paraelectric material film with a positive capacitance are connected in a series, the overall capacitance values of the ferroelectric material film and the paraelectric material film connected in this series may increase. Using an increase in the overall capacitance value, the transistor including the ferroelectric material film may have a sub-threshold swing (SS) below mV/decade at room temperature.

The ferroelectric material film may have ferroelectric characteristics. The ferroelectric material film may include, for example, at least one of hafnium oxide, hafnium zirconium oxide, barium strontium titanium oxide, barium titanium oxide, and lead zirconium titanium oxide. Herein, for example, the hafnium zirconium oxide may be a material in which hafnium oxide may be doped with zirconium (Zr). As another example, the hafnium zirconium oxide may be a compound of hafnium (Hf), zirconium (Zr) and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). The type of dopant included in the ferroelectric material film may vary depending on what ferroelectric material the ferroelectric material film includes.

When the ferroelectric material film includes hafnium oxide, the dopant included in the ferroelectric material film may include, for example, at least one of gadolinium (Gd), silicon (Si), zirconium (Zr), aluminum (Al) and yttrium (Y).

When the dopant is aluminum (Al), the ferroelectric material film may include 3 to 8% at % (atomic %) of aluminum. Herein, a ratio of the dopant may be the ratio of aluminum to the sum of hafnium and aluminum.

When the dopant is silicon (Si), the ferroelectric material film may include 2 to 10 at % of silicon. When the dopant is yttrium (Y), the ferroelectric material film may include 2 to 10 at % of yttrium. When the dopant is gadolinium (Gd), the ferroelectric material film may include 1 to 7 at % of gadolinium. When the dopant is zirconium (Zr), the ferroelectric material film may include 50 to 80 at % of zirconium.

The paraelectric material film may have paraelectric properties. The paraelectric material film may include, for example, at least one of silicon oxide and metal oxide with a high dielectric constant. The metal oxide included in the paraelectric material film may include, for example, at least one of hafnium oxide, zirconium oxide, and aluminum oxide, but the present disclosure is not limited thereto.

The ferroelectric material film and the paraelectric material film may include the same material. Although the ferroelectric material film has ferroelectric characteristics, the paraelectric material film may not have such ferroelectric characteristics. For example, when the ferroelectric material film and the paraelectric material film include hafnium oxide, the crystal structure of the hafnium oxide included in the ferroelectric material film differs from the crystal structure of the hafnium oxide included in the paraelectric material film.

The ferroelectric material film may have a thickness with ferroelectric characteristics. The thickness of the ferroelectric material film may be, for example, 0.5 to 10 nm, but the present disclosure is not limited thereto. Since a critical thickness indicative of the ferroelectric characteristics can vary across different ferroelectric materials, the thickness of the ferroelectric material film can change depending upon the ferroelectric material.

For example, the first gate insulating film 130 and the second gate insulating film 230 may include one ferroelectric material film. As another example, the first gate insulating film 130 and the second gate insulating film 230 may include a plurality of ferroelectric material films spaced apart from each other. The first gate insulating film 130 and the second gate insulating film 230 may have a stacked film structure where the plurality of ferroelectric material films and a plurality of paraelectric material films are alternately stacked.

Figure 8:
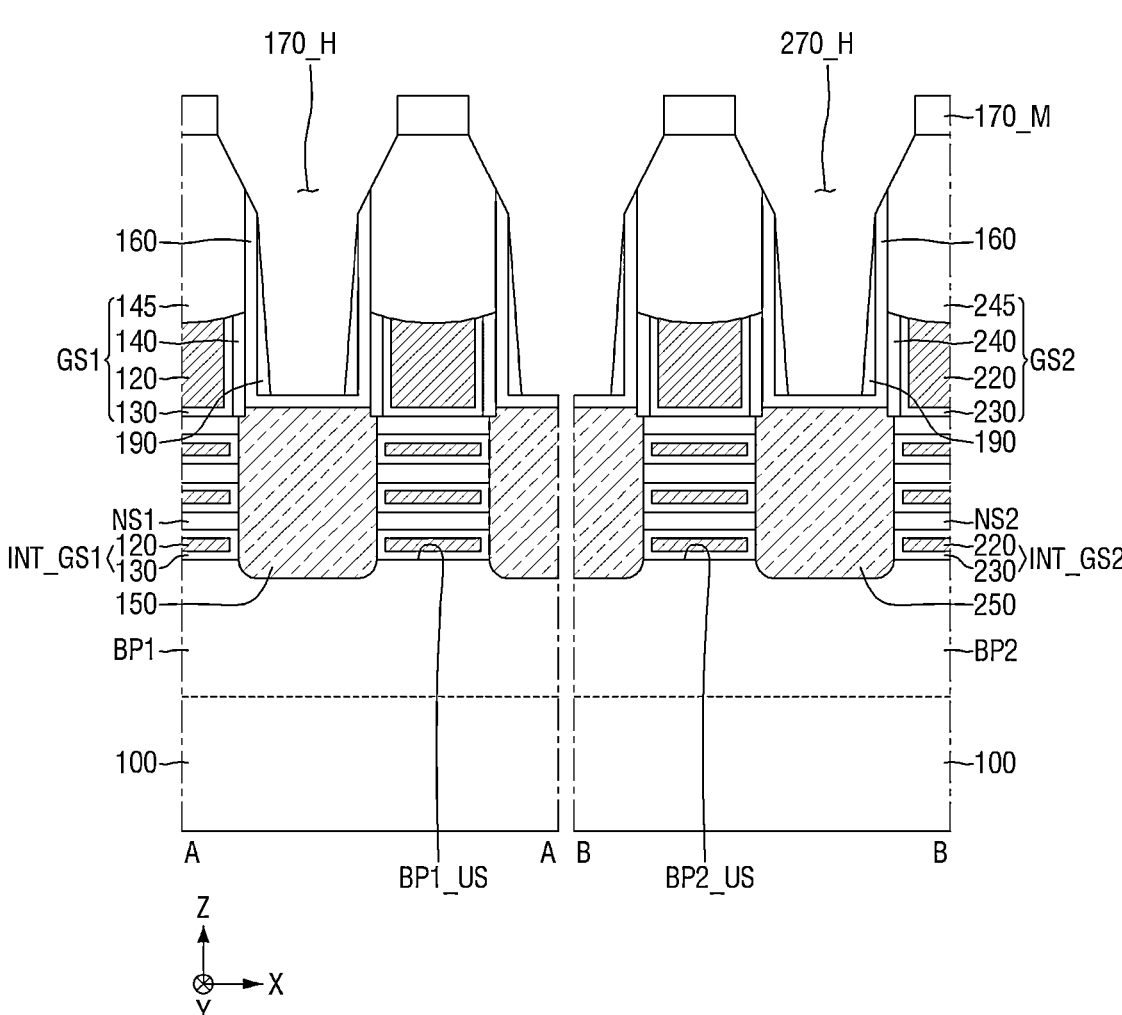

Referring to FIG. 8, a first contact hole 170_H and a second contact hole 270_H may be formed in the first interlayer insulating film 190.

The first contact hole 170_H may be formed in the first region I. The second contact hole 270_H may be formed in the second region II.

More specifically, a mask buffer film may be formed on the first gate structure GS1 and the second gate structure GS2. A mask pattern may be formed on the mask buffer film. The mask buffer film may include, for example, an oxide, but the present disclosure is not limited thereto.

By using the mask pattern as a mask, the first contact hole 170_H and the second contact hole 270_H can be formed in the first interlayer insulating film 190. In the process of forming the first contact hole 170_H and the second contact hole 270_H, the mask buffer film may be patterned. As the mask buffer film is patterned, a mask buffer pattern 170_M may be formed on the first gate structure GS1 and the second gate structure GS2.

The first contact hole 170_H and the second contact hole 270_H may expose the source/drain etch stop film 160. For example, while forming the mask buffer pattern 170_M, the first contact hole 170_H and the second contact hole 270_H may not penetrate the source/drain etch stop film 160. Bottom surfaces of the first contact hole 170_H and the second contact hole 270_H may be defined by the source/drain etch stop film 160.

Figure 9:
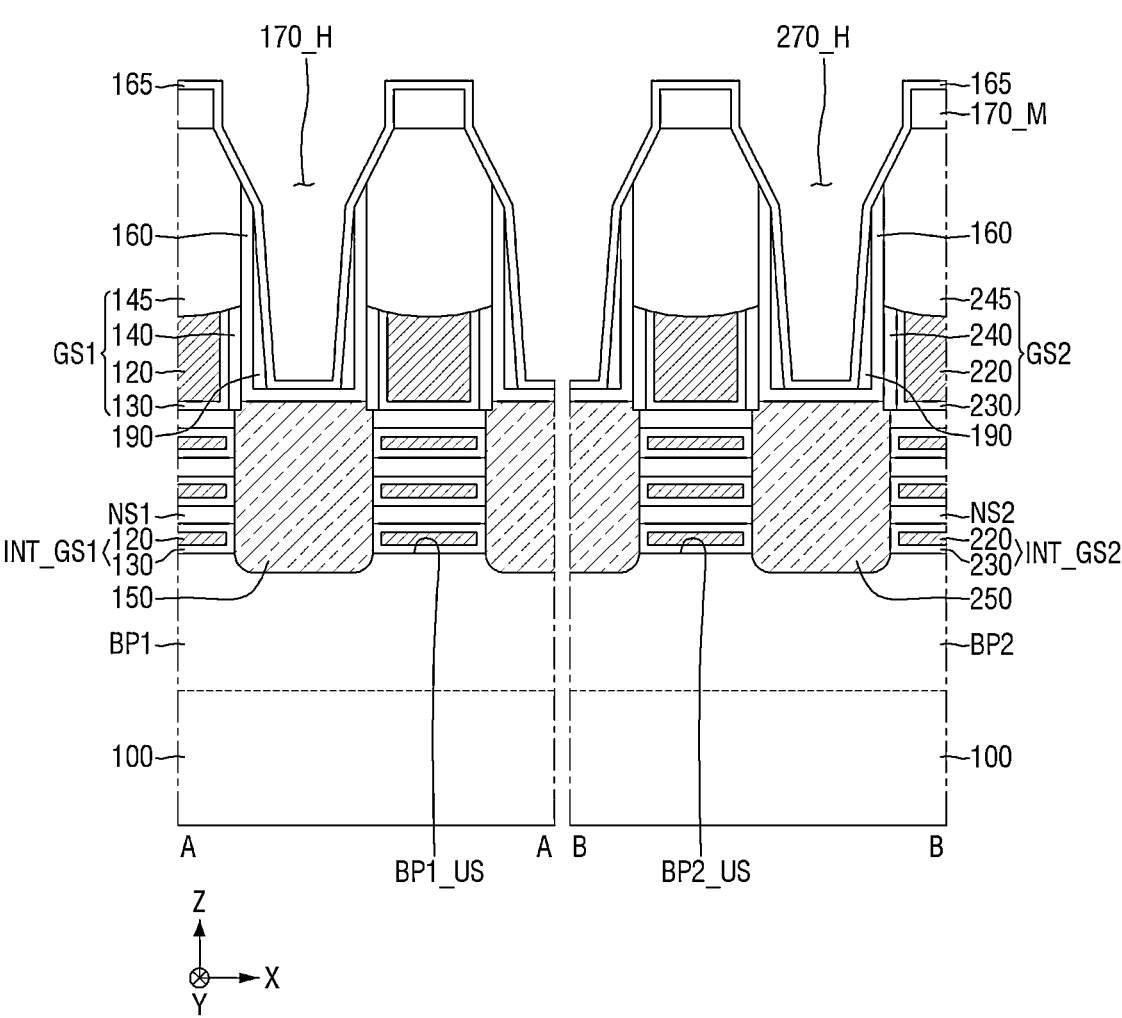

Referring to FIG. 9, a sacrificial liner 165 may be formed along the sidewall and bottom surface of the first contact hole 170_H, and the sidewall and bottom surface of the second contact hole 270_H.

The sacrificial liner 165 may be formed along an upper surface of the mask buffer pattern 170_M.

The sacrificial liner 165 may include at least one of silicon nitride (SiN), silicon carbide (SiC), silicon carbon nitride (SiCN), silicon oxide (SiO), silicon oxycarbide (SiOC), and silicon oxycarbon nitride (SiOCN). The sacrificial liner 165 is illustrated as a single film, but the present disclosure is not limited thereto. Unlike the illustrated configuration, the sacrificial liner 165 may be a multi-film including a plurality of films.

The sacrificial liner 165 may be formed using, for example, chemical vapor deposition (CVD) or atomic layer deposition (ALD), but the present disclosure is not limited thereto.

Figure 10:
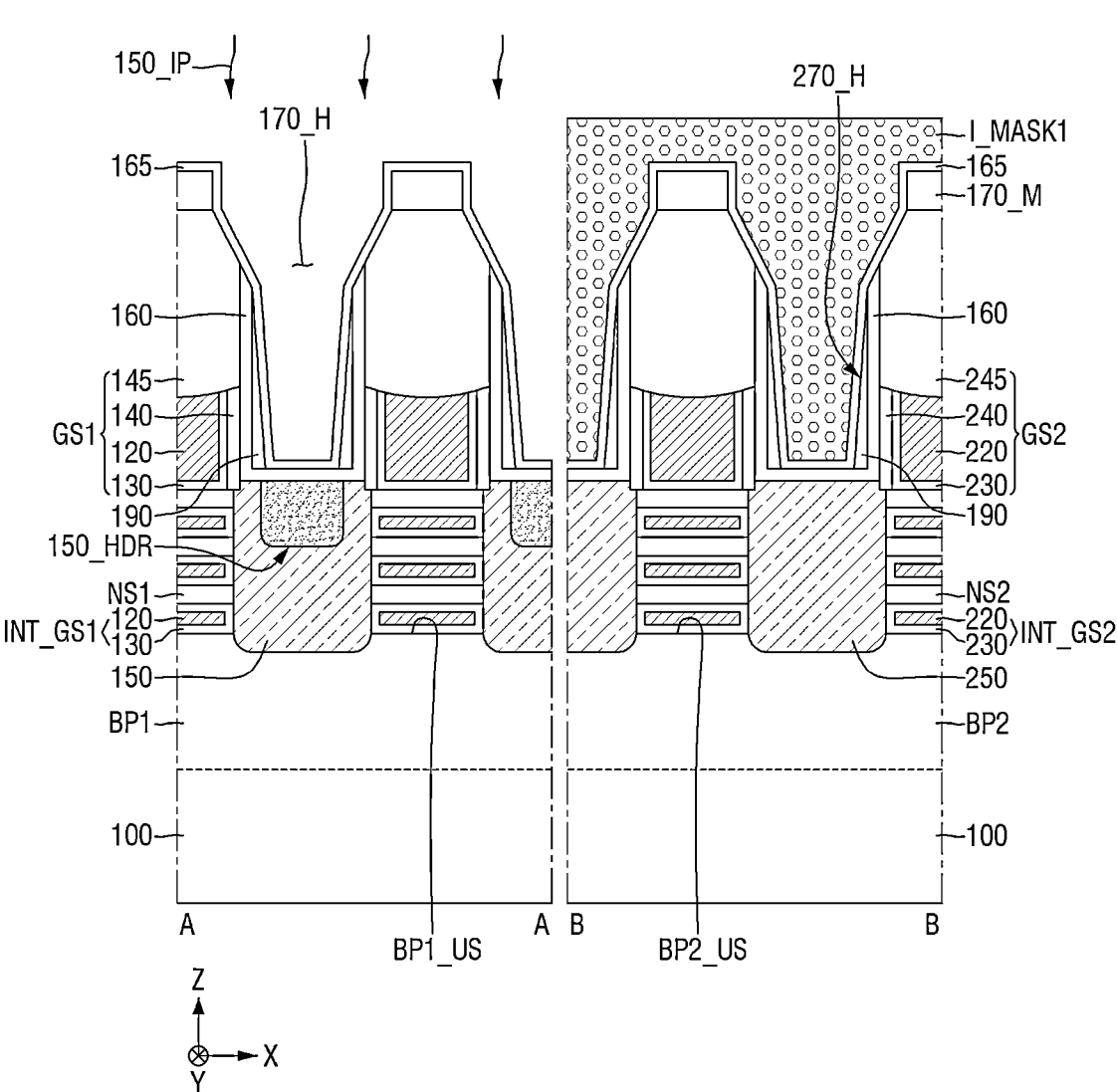

Referring to FIG. 10, a first blocking pattern I_MASK1 may be formed in the second region II. The first blocking pattern I_MASK1 may be formed on the sacrificial liner 165.

The first blocking pattern I_MASK1 fills the second contact hole 270_H. The first blocking pattern I_MASK1 fails to fill the first contact hole 170_H.

The first blocking pattern I_MASK1 may include a photosensitive film, an amorphous carbon layer (ACL), or a spin-on hard mask (SOH), but the present disclosure is not limited thereto.

In addition, a first ion implantation process 150_IP may be performed using the first blocking pattern I_MASK1 as a mask. In a state where the sacrificial liner 165 is formed, the first ion implantation process 150_IP may be performed.

By the first ion implantation process 150_IP, n-type impurities may be injected into the first source/drain pattern 150. Through the first ion implantation process 150_IP, a first high-concentration impurity region 150_HDR may be formed in the first source/drain pattern 150. In the state where the sacrificial liner 165 is formed, the first high-concentration impurity region 150_HDR may be formed.

Figure 11:
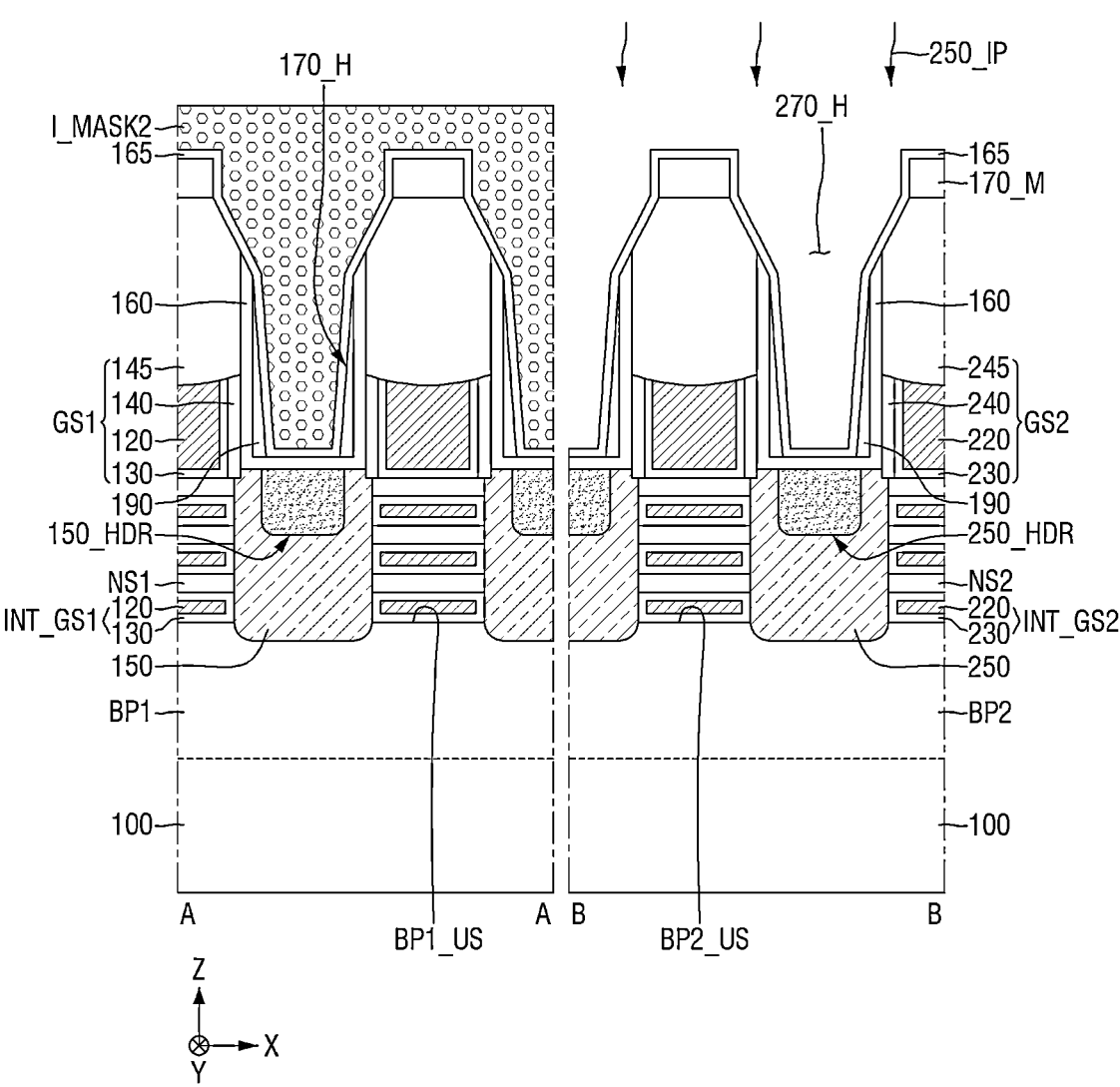

Referring to FIGS. 10 and 11, after performing the first ion implantation process 150_IP, the first blocking pattern I_MASK1 may be removed.

Subsequently, a second blocking pattern I_MASK2 may be formed in the first region I. The second blocking pattern I_MASK2 may be formed on the sacrificial liner 165.

The second blocking pattern I_MASK2 fills the first contact hole 170_H. The second blocking pattern I_MASK2 fails to fill the second contact hole 270_H.

The second blocking pattern I_MASK2 may include a photosensitive film, an amorphous carbon layer (ACL), or SOH, but the present disclosure is not limited thereto.

Furthermore, a second ion implantation process 250_IP may be performed using the second blocking pattern I_MASK2 as a mask. In the state where the sacrificial liner 165 is formed, the second ion implantation process 250_IP may be performed.

By the second ion implantation process 250_IP, p-type impurities may be injected into the second source/drain pattern 250. Through the second ion implantation process 250_IP, a second high-concentration impurity region 250_HDR may be formed in the second source/drain pattern 250. In the state where the sacrificial liner 165 is formed, the second high-concentration impurity region 250_HDR may be formed.

Figure 12:
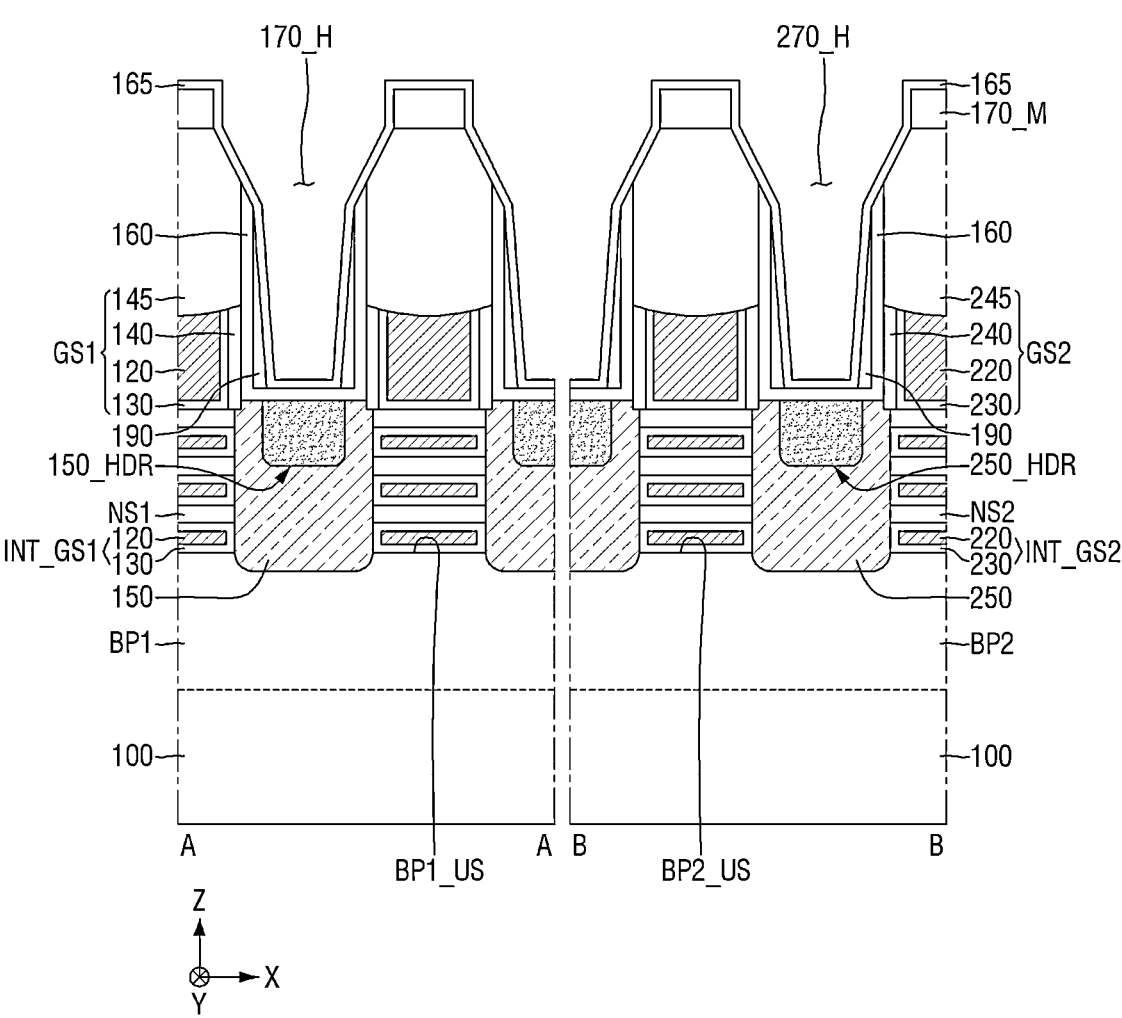

Referring to FIGS. 11 and 12, after performing the second ion implantation process 250_IP, the second blocking pattern I_MASK2 may be removed.

In the state where the sacrificial liner 165 is formed, the first high-concentration impurity region 150_HDR may be formed in the first source/drain pattern 150, and the second high-concentration impurity region 250_HDR may be formed in the second source/drain pattern 250.

While performing the first ion implantation process 150_IP and the second ion implantation process 250_IP, the sacrificial liner 165 may serve as a damage buffer. The sacrificial liner 165 may have suffered from plasma damage by the first ion implantation process 150_IP and the second ion implantation process 250_IP.

Figure 13:
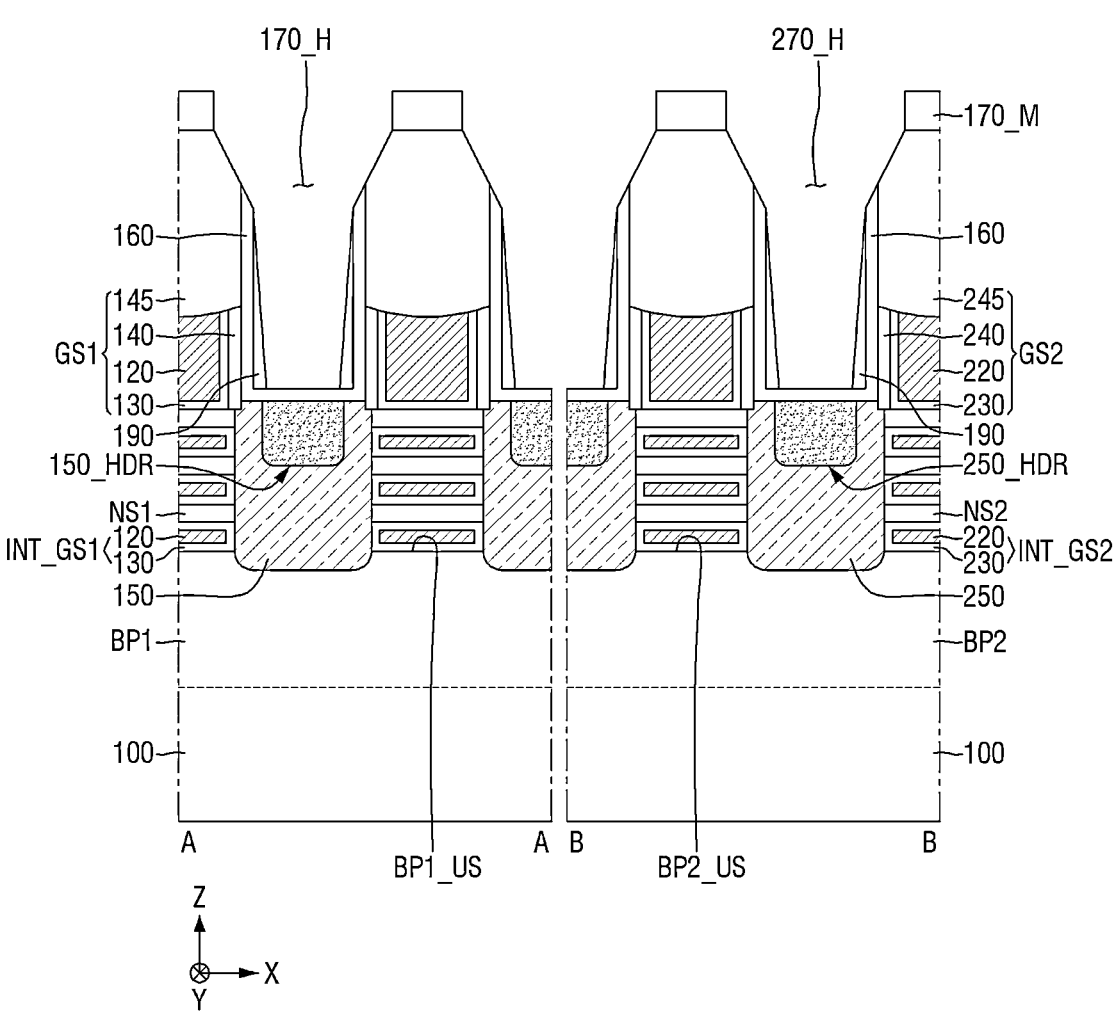

Referring to FIGS. 12 and 13, the sacrificial liner 165 may be removed.

The sacrificial liner 165 may be removed to expose the source/drain etch stop film 160.

Figure 14:
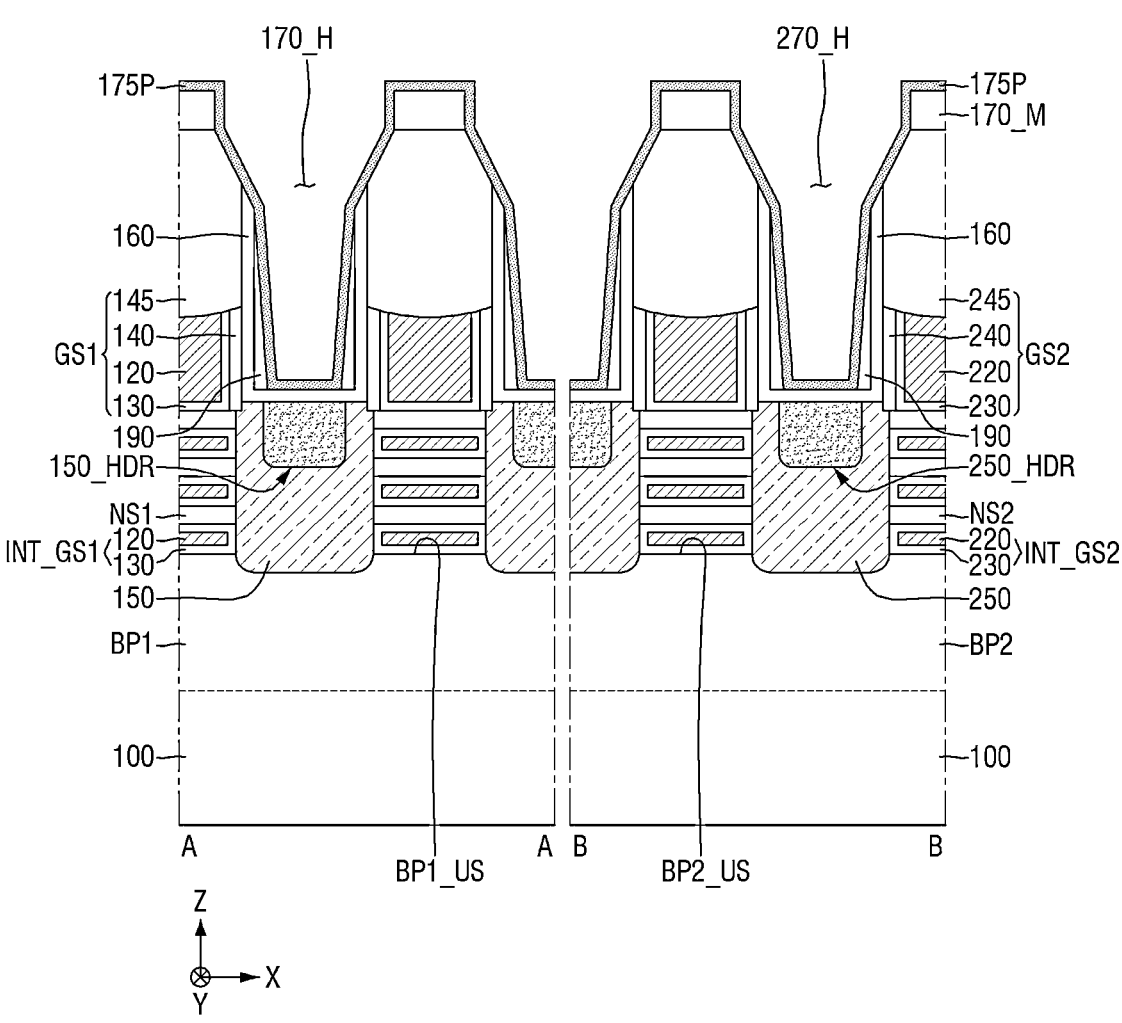

Referring to FIG. 14, a pre-contact liner 175P may be formed along the sidewall and bottom surface of the first contact hole 170_H, and the sidewall and bottom surface of the second contact hole 270_H.

The pre-contact liner 175P may be formed along the upper surface of the mask buffer pattern 170_M. The pre-contact liner 175P may be formed using, for example, a chemical vapor deposition (CVD), but the present disclosure is not limited thereto. For example, the pre-contact liner 175P may be conformally formed, but the present disclosure is not limited thereto.

The pre-contact liner 175P includes an insulating material. For example, the pre-contact liner 175P may be made of the insulating material.

The pre-contact liner 175P may include the insulating material including silicon (Si), carbon (C) and oxygen (O). For example, the pre-contact liner 175P may include silicon oxycarbide (SiOC). As another example, the pre-contact liner 175P may include silicon oxycarbide (SiOC) doped with hydrogen (H). As another example, the pre-contact liner 175P may include silicon oxycarbon nitride (SiOCN).

Alternatively, the pre-contact liner 175P may include a low dielectric constant material with a dielectric constant smaller than that of silicon oxide.

The pre-contact liner 175P may include, for example, one of a silicon oxycarbide film, a silicon oxycarbide film doped with hydrogen (H), a silicon oxycarbon nitride film, and a low dielectric constant material film.

Figure 15:
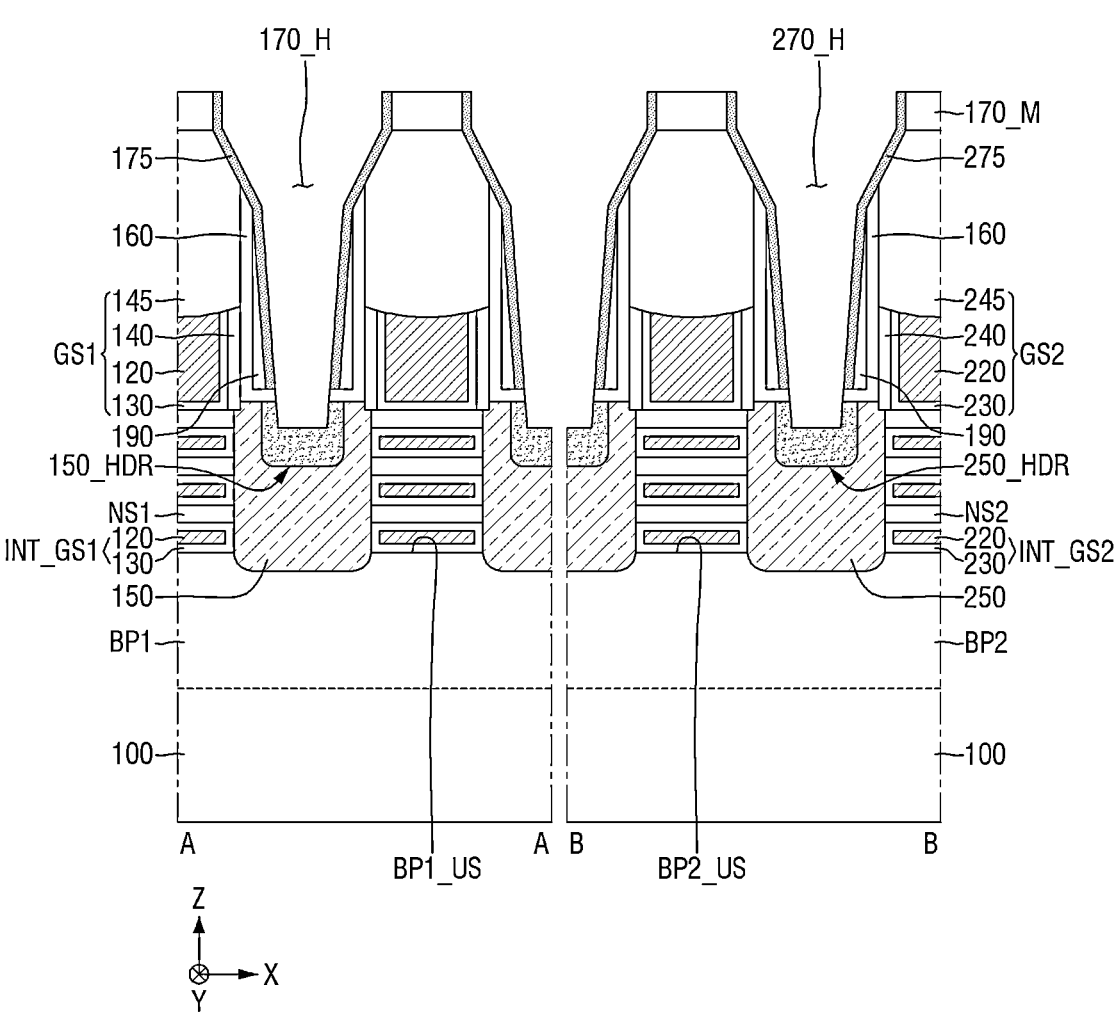

Referring to FIGS. 14 and 15, a first contact liner 175 and a second contact liner 275 may be formed by etching part of the pre-contact liner 175P.

The first contact liner 175 may be formed along the sidewall of the first contact hole 170_H. The second contact liner 275 may be formed along the sidewall of the second contact hole 270_H.

The first contact liner 175 may be formed by removing part of the source/drain etch stop film 160 and the pre-contact liner 175P extending along the bottom surface of the first contact hole 170_H. During the forming of the first contact liner 175, the first source/drain pattern 150 may be exposed. More specifically, during the forming of the first contact liner 175, the first high-concentration impurity region 150_HDR may be exposed. The first contact hole 170_H penetrates the source/drain etch stop film 160 to extend to the first source/drain pattern 150.

The second contact liner 275 may be formed by removing part of the source/drain etch stop film 160 and the pre-contact liner 175P extending along the bottom surface of the second contact hole 270_H. During the forming of the second contact liner 275, the second source/drain pattern 250 may be exposed. More specifically, during the forming of the second contact liner 275, the second high-concentration impurity region 250_HDR may be exposed. The second contact hole 270_H penetrates the source/drain etch stop film 160 to extend to the second source/drain pattern 250.

The first contact liner 175 and the second contact liner 275 may include one of a silicon oxycarbide (SiOC) film, a silicon oxycarbide (SiOC) film doped with hydrogen (H), a silicon oxycarbon nitride (SiOCN) film, and a low dielectric constant material film. In the following description, the first contact liner 175 and the second contact liner 275 include an insulating material including silicon (Si), carbon (C) and oxygen (O).

Figure 16:
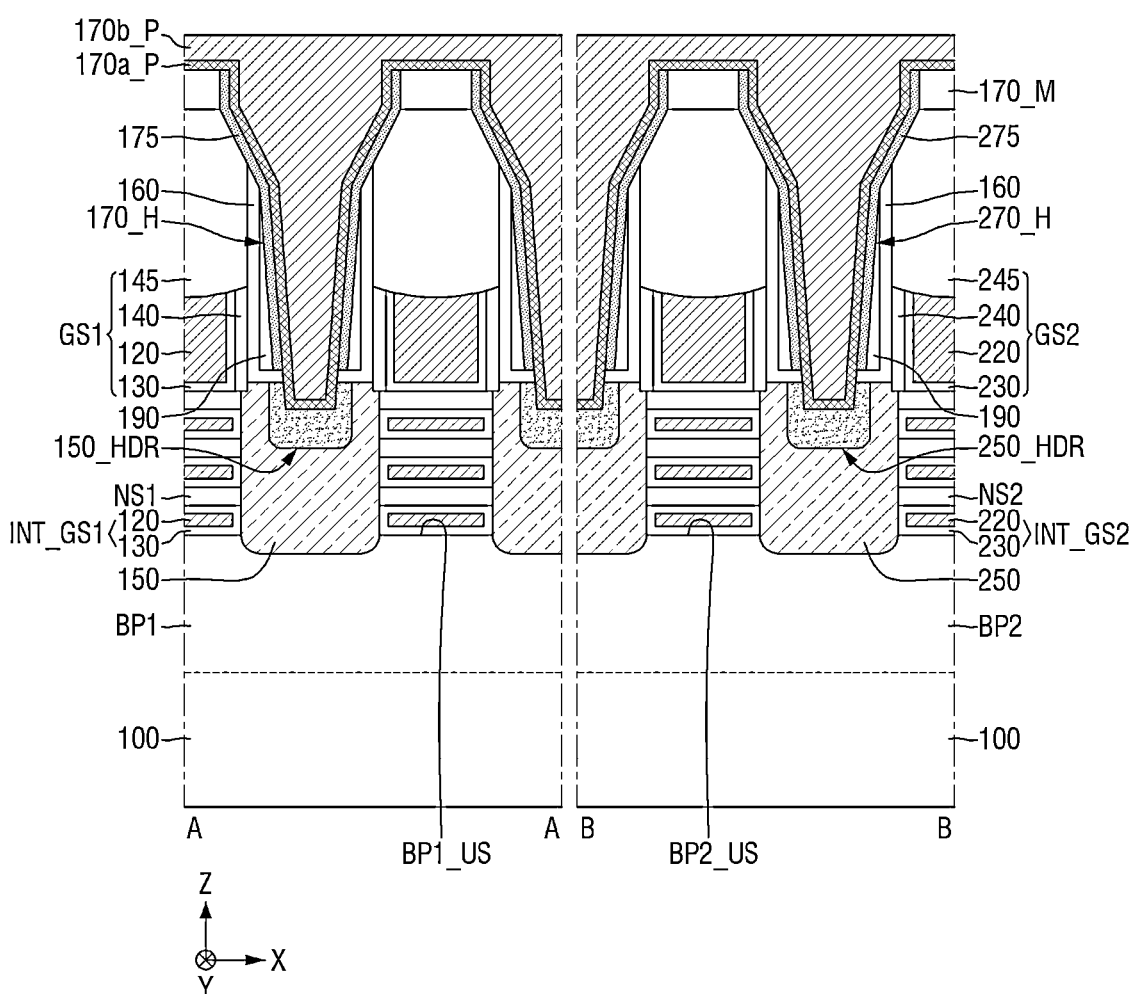

Referring to FIG. 16, a pre-barrier film 170a_P may be formed on the first contact liner 175 and the second contact liner 275.

The pre-barrier film 170a_P may be formed along the sidewall and bottom surface of the first contact hole 170_H. The pre-barrier film 170a_P may be formed along the sidewall and bottom surface of the second contact hole 270_H.

The pre-filling film 170b_P may be formed on the pre-barrier film 170a_P. The pre-fill film 170b_P may fill the first contact hole 170_H and the second contact hole 270_H.

For example, before forming the pre-barrier film 170a_P, a first contact silicide film 155 and a second contact silicide film 255 may be formed. As another example, during the forming of the pre-barrier film 170a_P, the first contact silicide film 155 and the second contact silicide film 255 may be formed. As another example, after forming the pre-filling film 170b_P, the first contact silicide film 155 and the second contact silicide film 255 may be formed via a thermal treatment process. Each of the first contact silicide film 155 and the second contact silicide film 255 may include a metal silicide material.

The pre-barrier film 170a_P may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbon nitride (WCN), zirconium (Zr), zirconium nitride (ZrN), vanadium (V), vanadium nitride (VN), niobium (Nb), niobium nitride (Nb), platinum (Pt), iridium (Ir), rhodium (Rh), and a two-dimensional (2D) material. In the method of fabricating a semiconductor device according to some embodiments, the two-dimensional (2D) material may be a metallic material and/or a semiconductor material. The 2D material may include a 2D allotrope or a 2D compound, and may include, for example, at least one of graphene, molybdenum disulfide ($MoS_2$), molybdenum diselenide ($MoSe_2$), tungsten diselenide ($WSe_2$), and tungsten disulfide ($WS_2$), but the present disclosure is not limited thereto. In other words, since the aforementioned two-dimensional material is listed only as an example, the two-dimensional material that may be included in the method of fabricating a semiconductor device of the present disclosure is not limited by the aforementioned material.

The pre-filling film 170b_P may include, for example, at least one of aluminum (Al), tungsten (W), cobalt (Co), ruthenium (Ru), silver (Ag), gold (Au), manganese (Mn), and molybdenum (Mo), but the present disclosure is not limited thereto.

Figure 17:
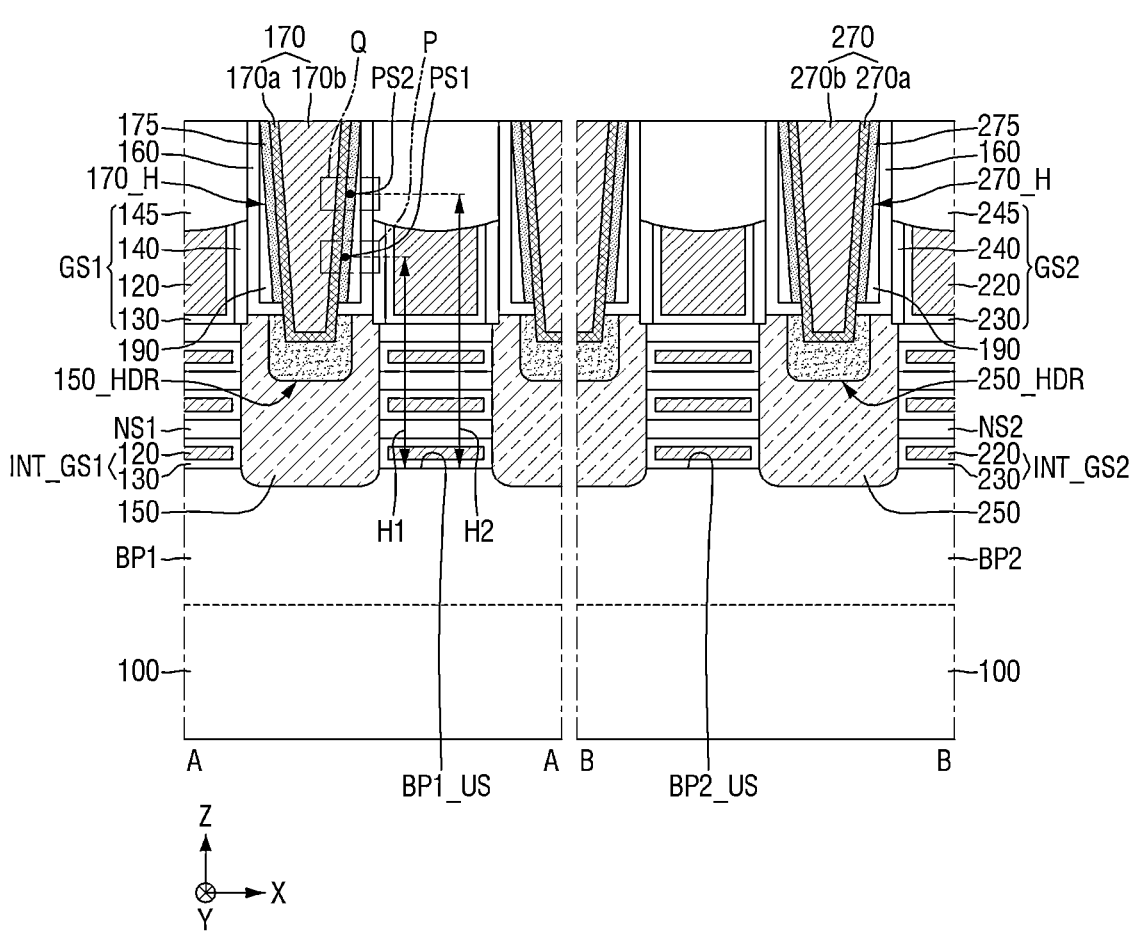

Referring to FIGS. 16 and 17, a first source/drain contact 170 that fills the first contact hole 170_H may be formed on the first contact liner 175. A second source/drain contact 270 that fills the second contact hole 270_H may be formed on the second contact liner 275.

The first source/drain contact 170 may be formed on the first source/drain pattern 150. The first source/drain contact 170 may be connected to the first source/drain pattern 150. The first source/drain contact 170 may include a first source/drain barrier film 170a and a first source/drain filling film 170b on the first source/drain barrier film 170a.

The second source/drain contact 270 may be formed on the second source/drain pattern 250. The second source/drain contact 270 may be connected to the second source/drain pattern 250. The second source/drain contact 270 may include a second source/drain barrier film 270a and a second source/drain filling film 270b on the second source/drain barrier film 270a.

More specifically, the first source/drain contact 170 and the second source/drain contact 270 may be formed by removing part of the pre-barrier film 170a_P and part of the pre-filling film 170b_P. During the forming of the first source/drain contact 170 and the second source/drain contact 270, the mask buffer pattern 170_M may be removed. In addition, during the forming of the first source/drain contact 170 and the second source/drain contact 270, part of the first gate capping pattern 145 and part of the second gate capping pattern 245 may be also removed.

The first contact liner 175 may extend to an upper surface of the first gate structure GS1. The second contact liner 275 may extend to an upper surface of the second gate structure GS2.

The following description will be described centering on the first contact liner 175. The description of the first contact liner 175 can be applied to the second contact liner 275.

In FIG. 17, the first contact liner 175 may include a first point PS1 and a second point PS2. A height H1 from the upper surface BP1_US of the first fin-type pattern to the first point PS1 may be smaller than a height H2 from the upper surface BP1_US of the first fin-type pattern to the second point PS2.

In the method of fabricating a semiconductor device according to some embodiments, the thickness of the first contact liner 175 may be constant as the first contact liner 175 moves away from the upper surface BP1_US of the first fin-type pattern. The first contact liner 175 extending along a sidewall of the first source/drain contact 170 may have a uniform thickness. For example, in FIG. 18, a thickness t11 of the first contact liner 175 at the first point PS1 of the first contact liner 175 may be the same as a thickness t12 of the first contact liner 175 at the second point PS2 of the first contact liner 175.

In the method of fabricating a semiconductor device according to some embodiments, the concentration of carbon included in the first contact liner 175 may vary as the first contact liner 175 moves away from the upper surface BP1_US of the first fin-type pattern. As the first contact liner 175 moves away from the upper surface BP1_US of the first fin-type pattern, the concentration of carbon included in the first contact liner 175 may increase. The concentration of carbon included in the first contact liner 175 may be expressed as an atomic percent (at. %), but the present disclosure is not limited thereto.

In FIG. 19, the concentration (indicated as "X") of carbon included in the first contact liner 175 at the first point PS1 of the first contact liner 175 may be below the concentration of carbon included in the first contact liner 175 at the second point PS2 of the first contact liner 175. In addition, the ratio (C/O ratio, indicated as "O") of carbon (C) to oxygen (O) at the first point PS1 of the first contact liner 175 may be less than the ratio of carbon (C) to oxygen (O) at the second point PS2 of the first contact liner 175.

Unlike the illustrated configuration, the concentration of carbon included in the first contact liner 175 at the first point PS1 of the first contact liner 175 may be greater than the concentration of carbon included in the first contact liner 175 at the second point PS2 of the first contact liner 175. In the method of fabricating a semiconductor device according to some embodiments, it will be described that the concentration of carbon included in the first contact liner 175 increases as the first contact liner 175 moves away from the upper surface BP1_US of the first fin-type pattern.

In the method of fabricating a semiconductor device according to some embodiments, the concentration of carbon included in the first contact liner 175 may be constant as the first contact liner 175 moves away from the upper surface BP1_US of the first fin-type pattern.

In FIG. 20, the concentration (indicated as "X") of carbon included in the first contact liner 175 at the first point PS1 of the first contact liner 175 may be the same as the concentration of carbon included in the first contact liner 175 at the second point PS2 of the first contact liner 175. In addition, the ratio (C/O ratio, indicated as "O") of carbon (C)

to oxygen O at the first point PS1 of the first contact liner 175 may be the same as the ratio of carbon (C) to oxygen (O) at the second point PS2 of the first contact liner 175.

In the method of fabricating a semiconductor device according to some embodiments, as the first contact liner 175 moves away from the first source/drain contact 170, the ratio (C/O) of carbon to oxygen (O) included in the first contact liner 175 may increase. The peak of the oxygen concentration included in the first contact liner 175 may be closer to the first source/drain contact 170 than the peak of the carbon concentration included in the first contact liner 175.

In the method of manufacturing a semiconductor device according to some embodiments, as the first contact liner 175 moves away from the first source/drain contact 170, the ratio (C/O) of carbon to oxygen (O) included in the first contact liner 175 may be constant. A peak position of the oxygen concentration included in the first contact liner 175 may be the same as a peak position of the carbon concentration included in the first contact liner 175.

Figure 23:
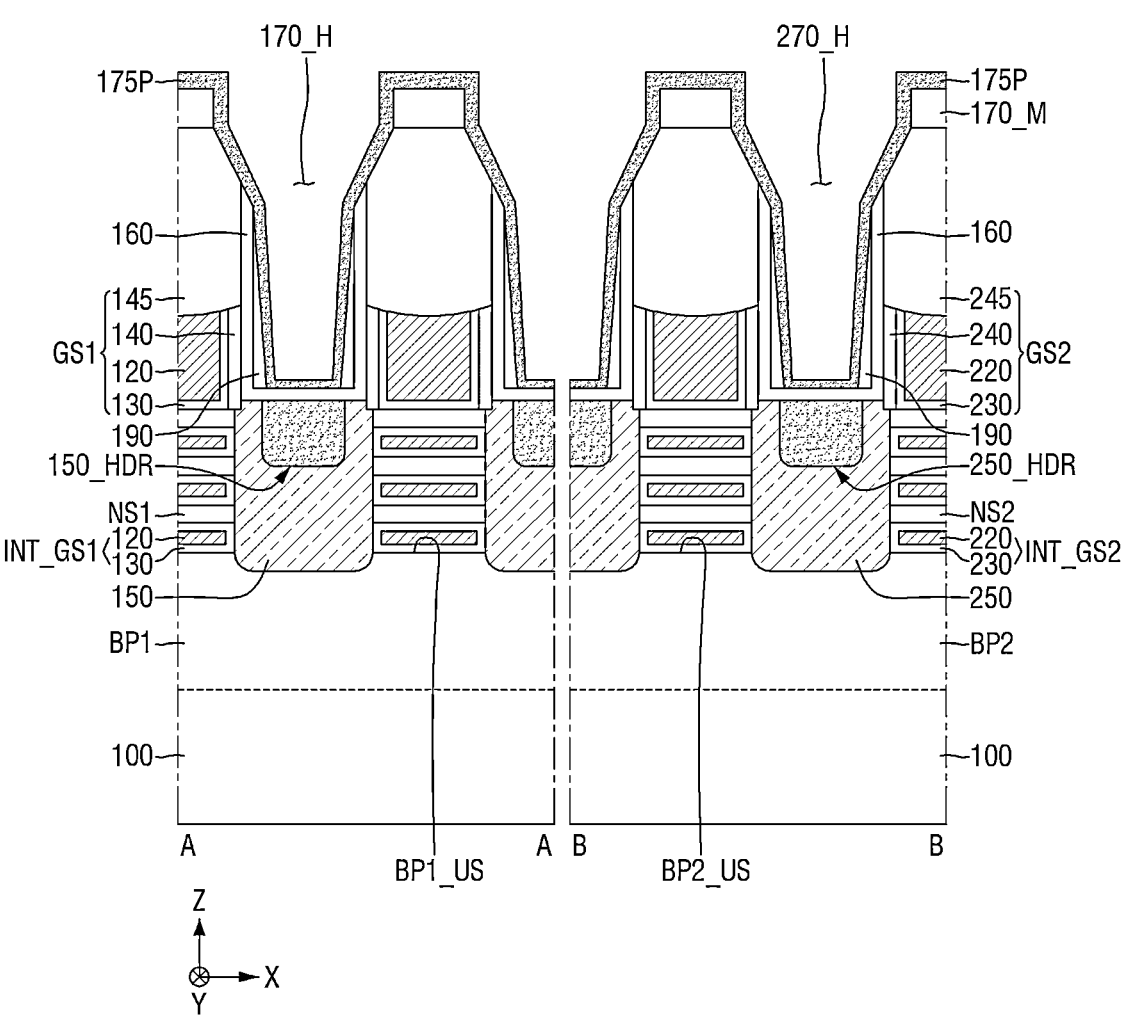
FIGS. 23 to 25 are intermediate step diagrams for describing a method of fabricating a semiconductor device according to some embodiments.
Figure 24:
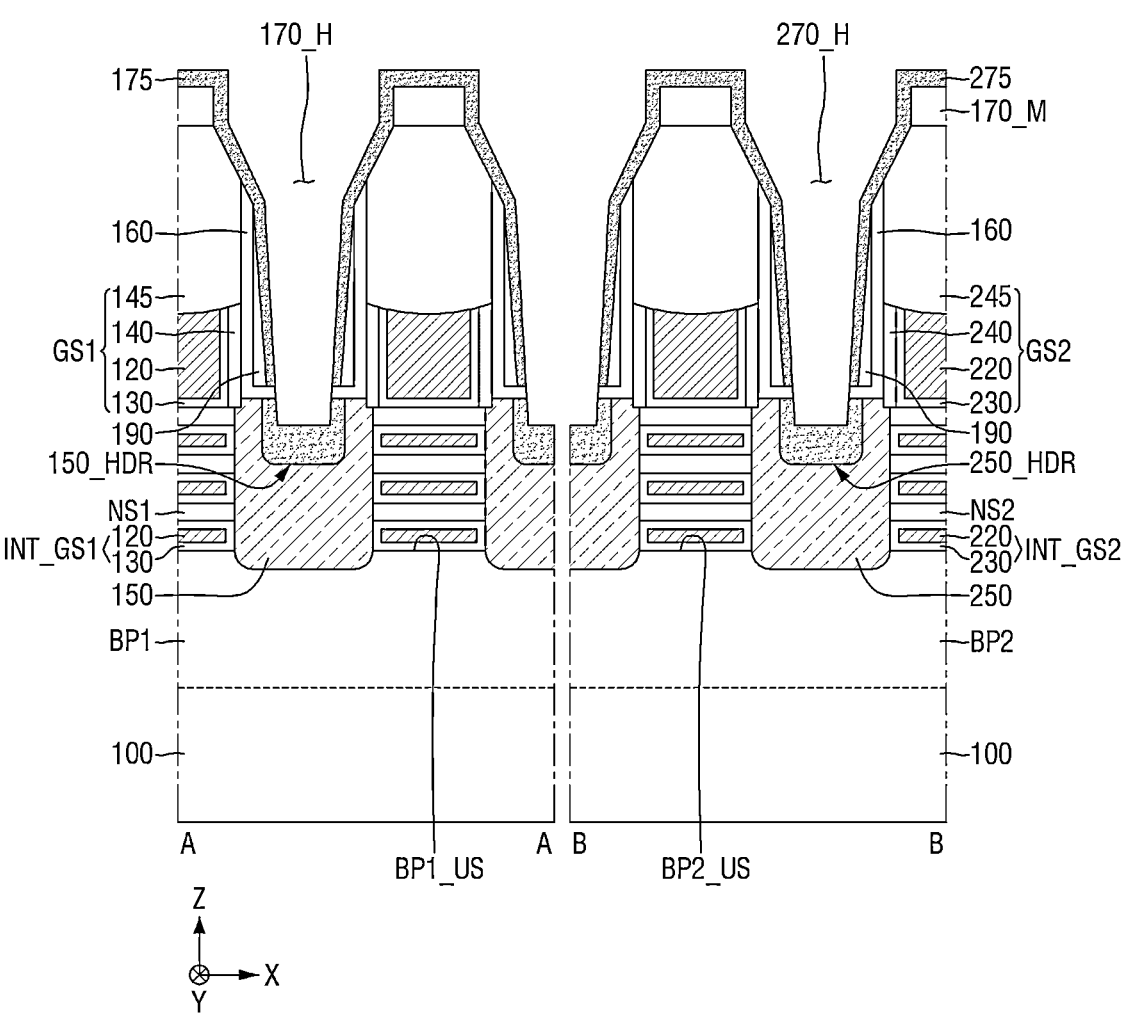
Figure 25:
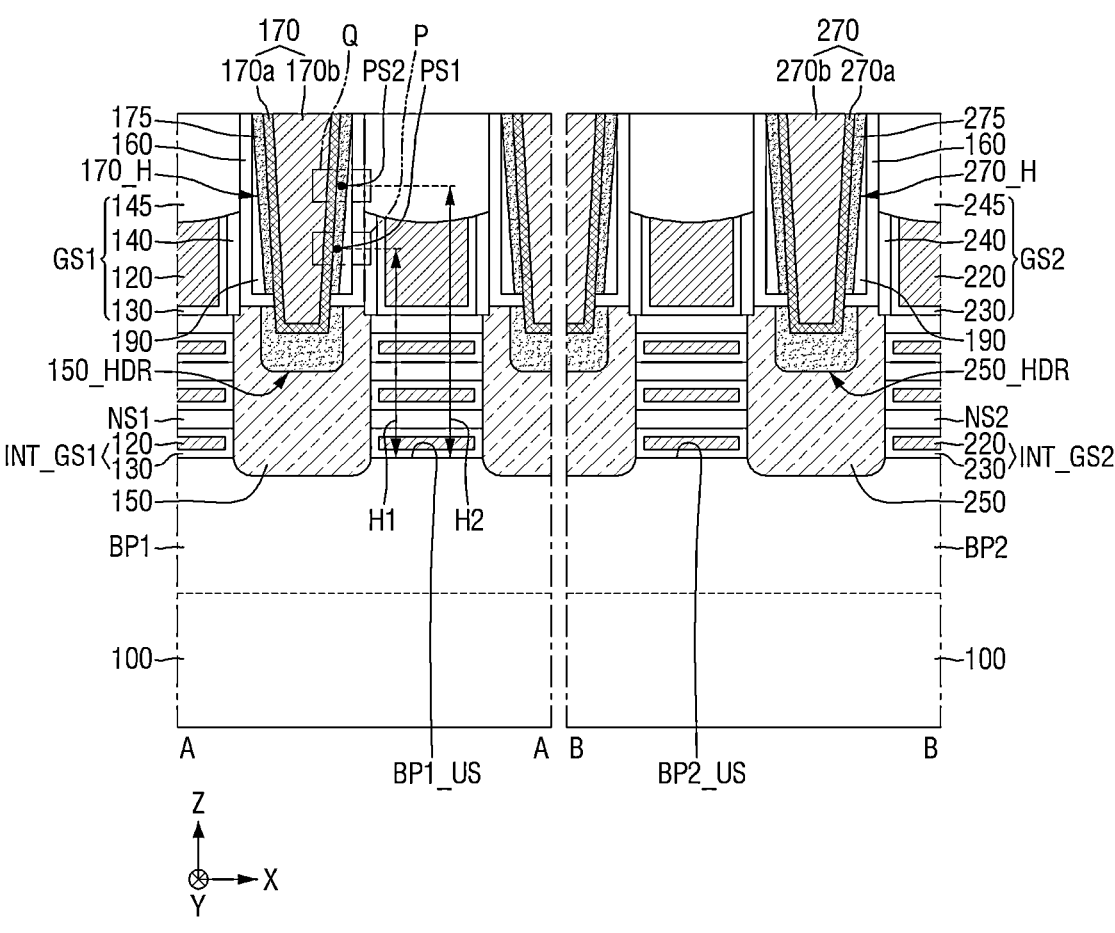
Figure 26:
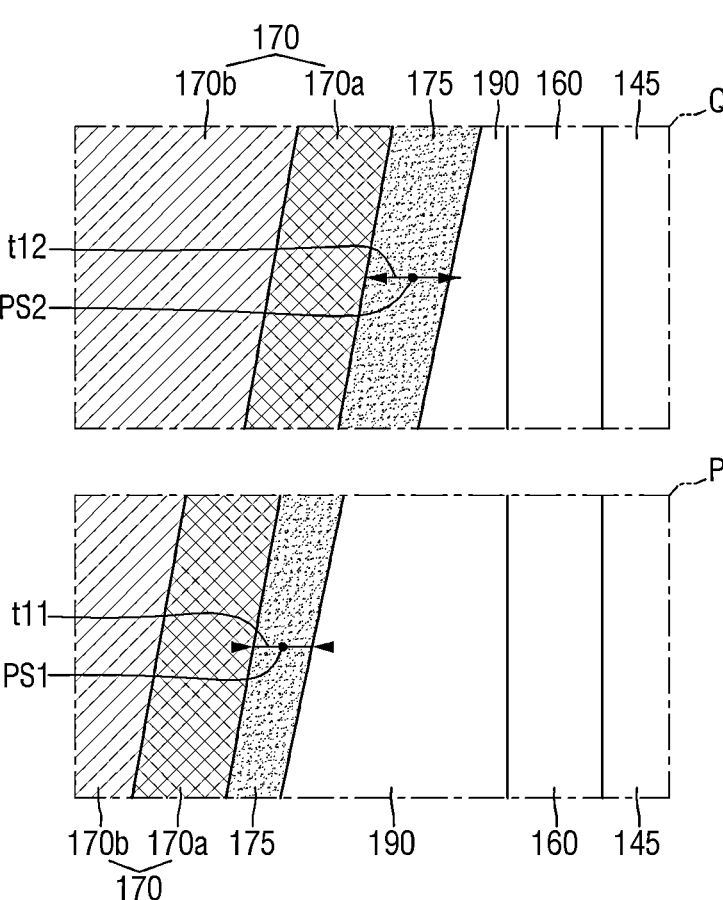
FIG. 26 is an enlarged view illustrating a part P and a part Q of FIG. 25.

FIGS. 23 to 25 are intermediate step diagrams describing a method of fabricating a semiconductor device according to some embodiments. FIG. 26 is an enlarged view illustrating part P and part Q of FIG. 25. For reference, FIG. 23 may be a fabricating process performed after FIG. 13.

Referring to FIG. 23, the pre-contact liner 175P may be formed along the sidewall and bottom surface of the first contact hole 170_H, and the sidewall and bottom surface of the second contact hole 270_H.

A thickness of the pre-contact liner film 175P extending along the sidewall of the first contact hole 170_H and the sidewall of the second contact hole 270_H may decrease as the pre-contact liner film 175P moves away from the upper surface of the mask buffer pattern 170_M.

For example, with regard to the upper surface BP1_US of the first fin-type pattern, the thickness of the pre-contact liner film 175P at a second height may be greater than the thickness of the pre-contact liner film 175P at a first height. With regard to the upper surface BP1_US of the first fin-type pattern, the thickness of the pre-contact liner film 175P at the second height may be below the one of the pre-contact liner film 175P at a third height. The second height may be greater than the first height and less than the third height.

Referring to FIGS. 23 and 24, the first contact liner 175 and the second contact liner 275 whose thickness varies may be formed by etching part of the pre-contact liner 175P.

As the first contact liner 175 moves away from the upper surface of the mask buffer pattern 170_M, the thickness of the first contact liner 175 extending along the sidewall of the first contact hole 170_H may decrease. As the second contact liner 275 moves away from the upper surface of the mask buffer pattern 170_M, the thickness of the second contact liner 275 extending along the sidewall of the second contact hole 270_H may decrease.

Referring to FIG. 25, the first source/drain contact 170 that fills the first contact hole 170_H may be formed on the first contact liner 175.

The second source/drain contact 270 that fills the second contact hole 270_H may be formed on the second contact liner 275.

As the first contact liner 175 moves away from the upper surface BP1_US of the first fin-type pattern, the thickness of the first contact liner 175 may vary. For example, as the first contact liner 175 moves away from the upper surface BP1_US of the first fin-type pattern, the thickness of the first contact liner 175 may increase.

The height H1 from the upper surface BP1_US of the first fin-type pattern to the first point PS1 may be less than the height H2 from the upper surface BP1_US of the first fin-type pattern to the second point PS2. In FIG. 26, the thickness t11 of the first contact liner 175 at the first point PS1 of the first contact liner 175 may be less than the thickness t12 of the first contact liner 175 at the second point PS2 of the first contact liner 175.

FIGS. 27 to 30 are intermediate step diagrams describing a method of fabricating a semiconductor device according to some embodiments. For reference, FIG. 27 may be a fabricating process performed after FIG. 12.

Figure 27:
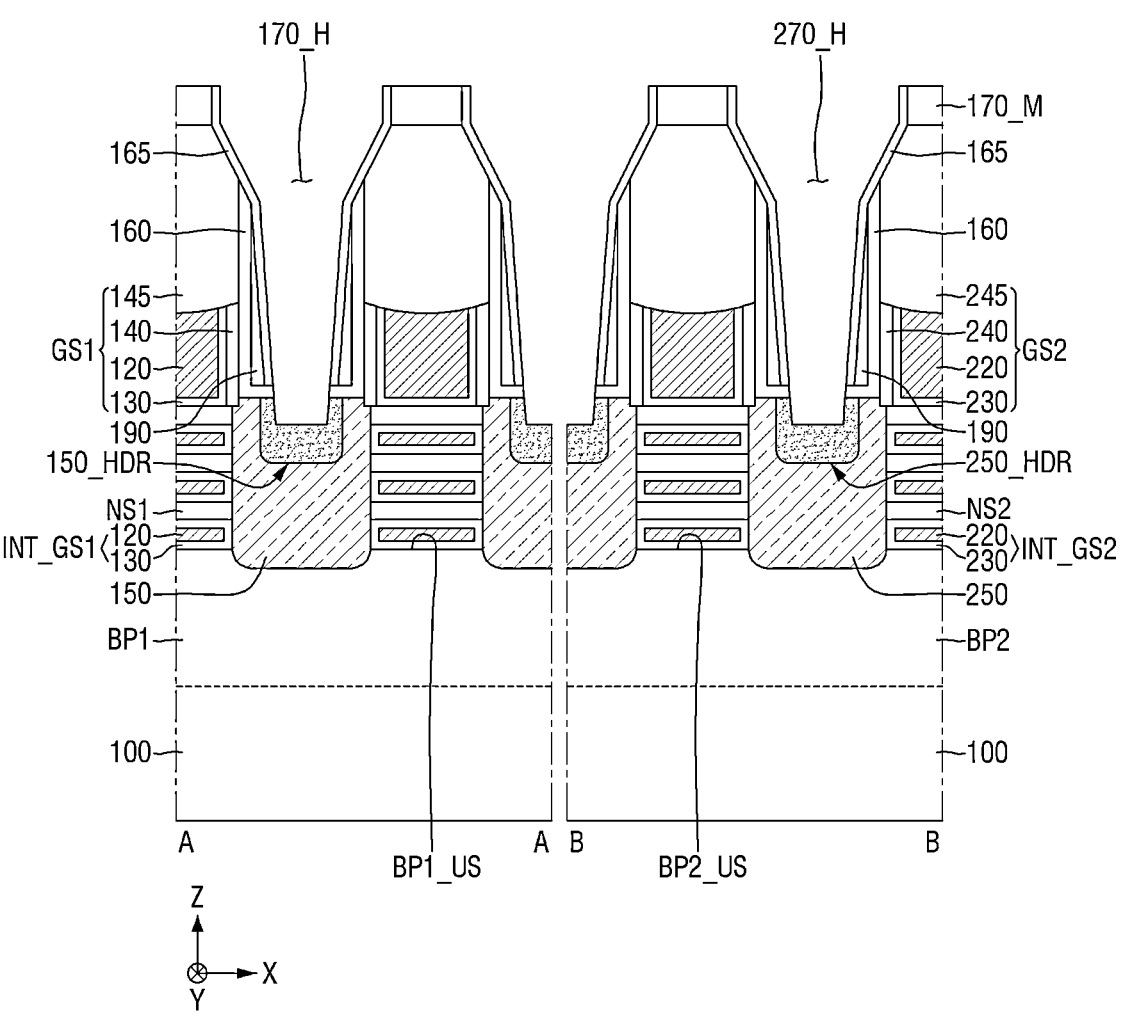
FIGS. 27 to 30 are intermediate step diagrams describing a method of fabricating a semiconductor device according to some embodiments.

Referring to FIG. 27, the first source/drain pattern 150 may be exposed by removing part of the source/drain etch stop film 160 and the sacrificial liner 165 extending along the bottom surface of the first contact hole 170_H.

The second source/drain pattern 250 may be exposed by removing part of the source/drain etch stop film 160 and the sacrificial liner 165 extending along the bottom surface of the second contact hole 270_H.

With the sacrificial liner 165 remaining on the sidewall of the first contact hole 170_H, the first high-concentration impurity region 150_HDR may be exposed. With the sacrificial liner 165 remaining on the sidewall of the second contact hole 270_H, the second high-concentration impurity region 250_HDR may be exposed.

In a state where the sacrificial liner 165 remains, the first contact hole 170_H penetrates the source/drain etch stop film 160 to extend to the first source/drain pattern 150. In the state where the sacrificial liner 165 remains, the second contact hole 270_H penetrates the source/drain etch stop film 160 to extend to the second source/drain pattern 250.

Figure 28:
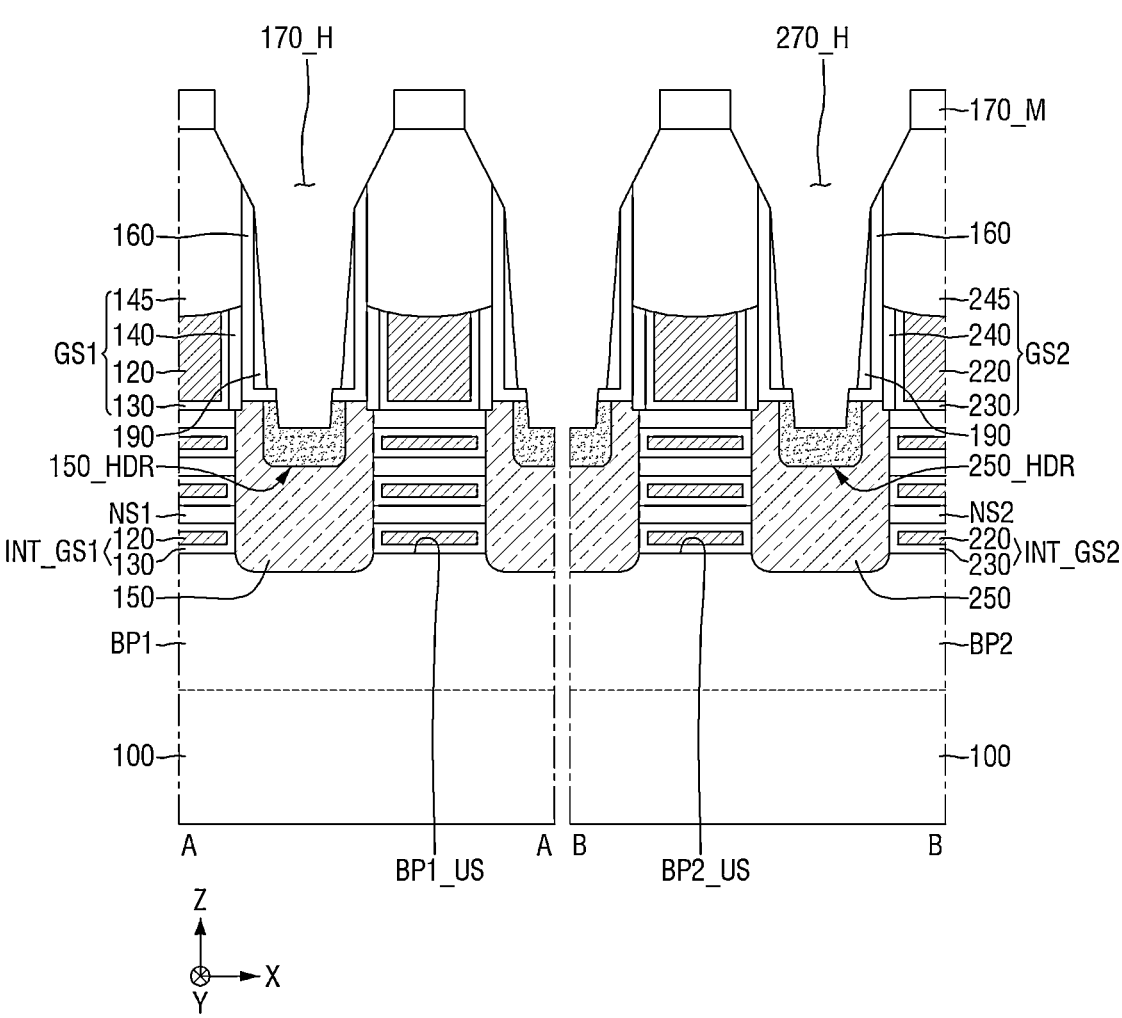

Referring to FIGS. 27 and 28, the sacrificial liner 165 extending along the sidewall of a first contact hole 170_H and the sacrificial liner 165 extending along a sidewall of the second contact hole 270_H may be removed.

In a state where the first high-concentration impurity region 150_HDR and the second high-concentration impurity region 250_HDR are exposed, the sacrificial liner 165 may be removed.

Figure 29:
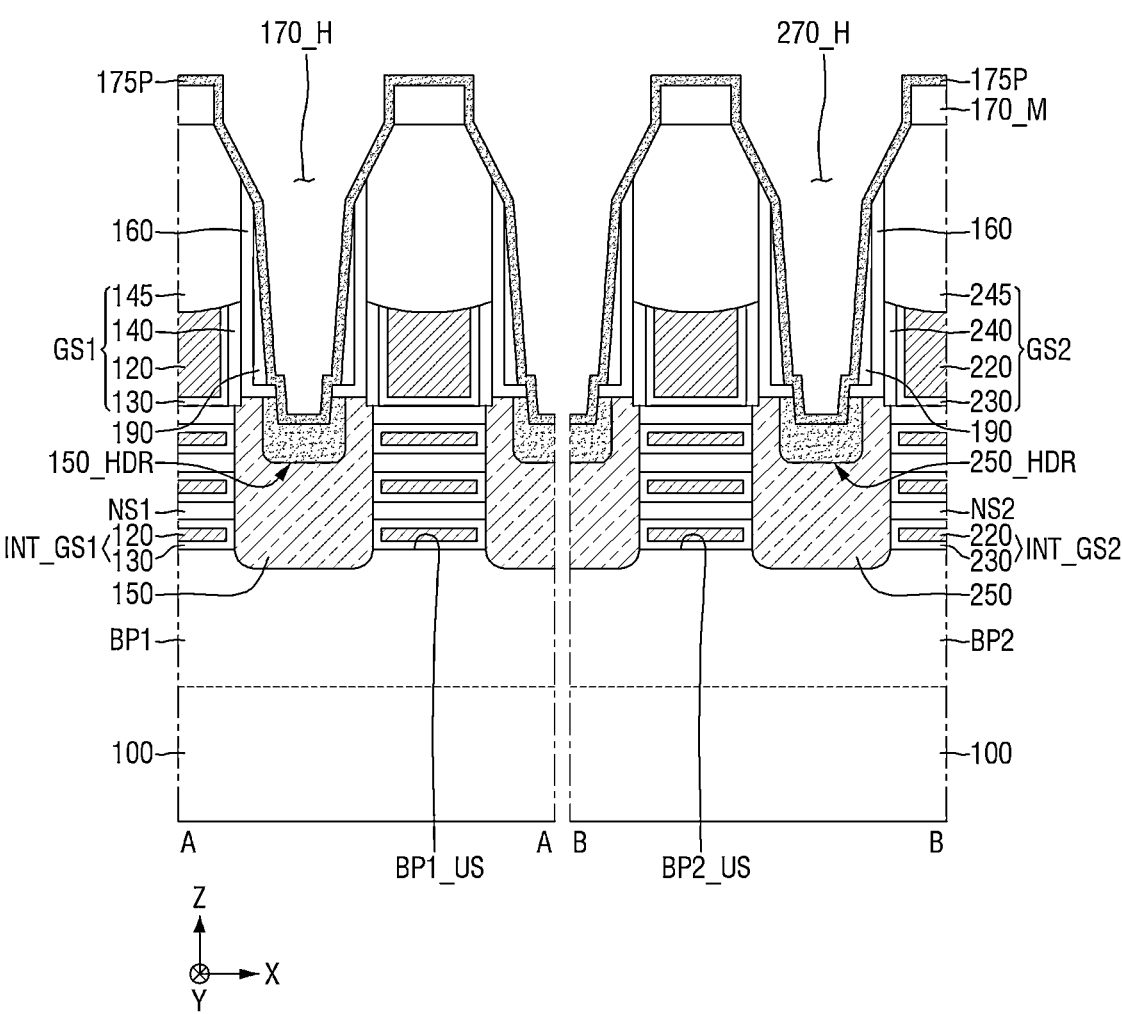

Referring to FIG. 29, the pre-contact liner 175P may be formed along the sidewall and bottom surface of the first contact hole 170_H and the sidewall and bottom surface of the second contact hole 270_H.

The pre-contact liner 175P may be in contact with the first source/drain pattern 150 and the second source/drain pattern 250. For example, the pre-contact liner 175P may be in contact with the first high-concentration impurity region 150_HDR and the second high-concentration impurity region 250_HDR.

Figure 30:
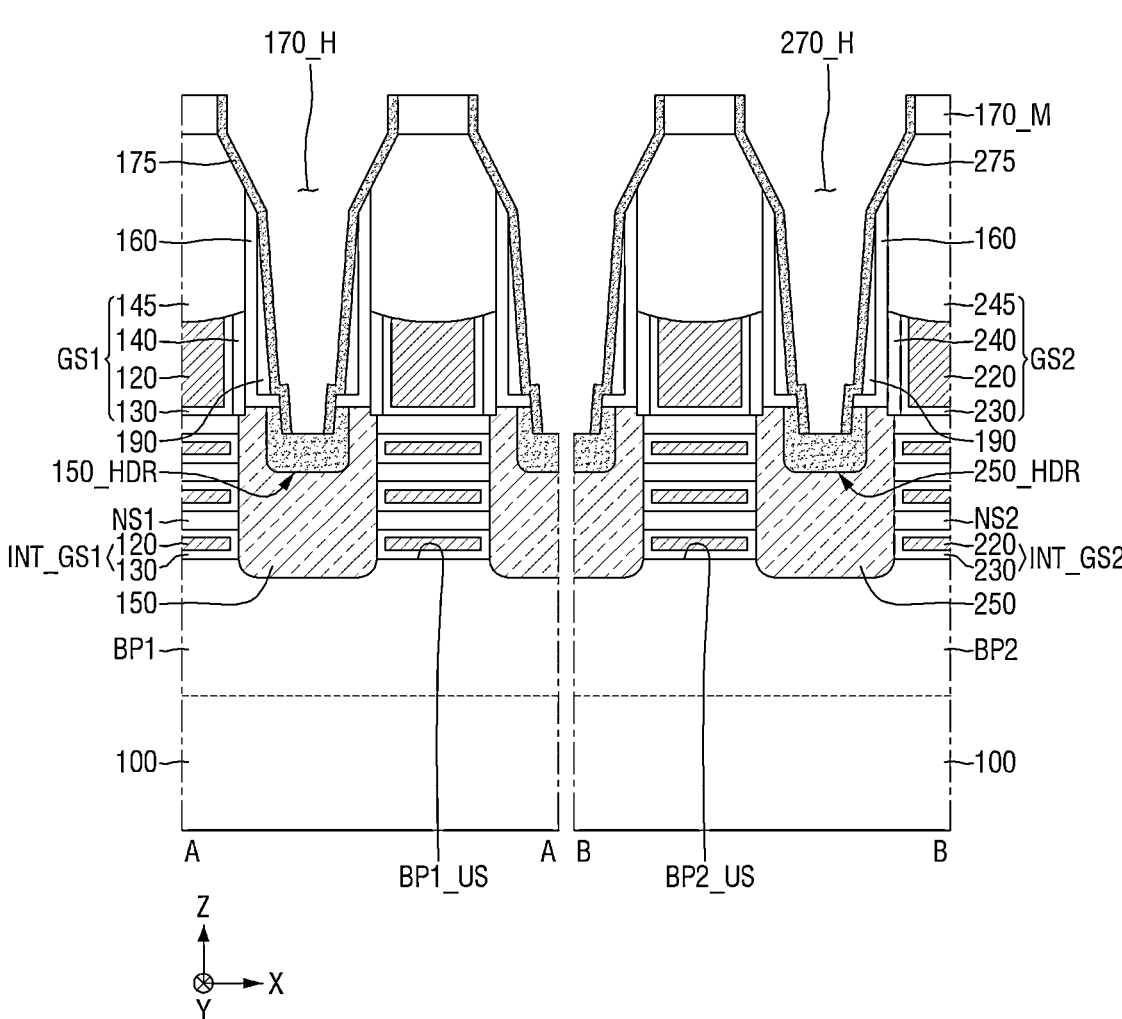

Referring to FIG. 30, the first high-concentration impurity region 150_HDR and the second high-concentration impurity region 250_HDR may be exposed by etching part of the pre-contact liner 175P.

The first contact liner 175 may be formed along the sidewall of the first contact hole 170_H. The first contact liner 175 may extend to the first source/drain pattern 150 to contact the first high-concentration impurity region 150_HDR.

The second contact liner 275 may be formed along the sidewall of the second contact hole 270_H. The second contact liner 275 may extend to the second source/drain pattern 250 to contact the second high-concentration impurity region 250_HDR.

In addition, the first source/drain contact 170 may be formed in the first contact hole 170_H. The second source/drain contact 270 may be formed in the second contact hole 270_H.

Figure 31:
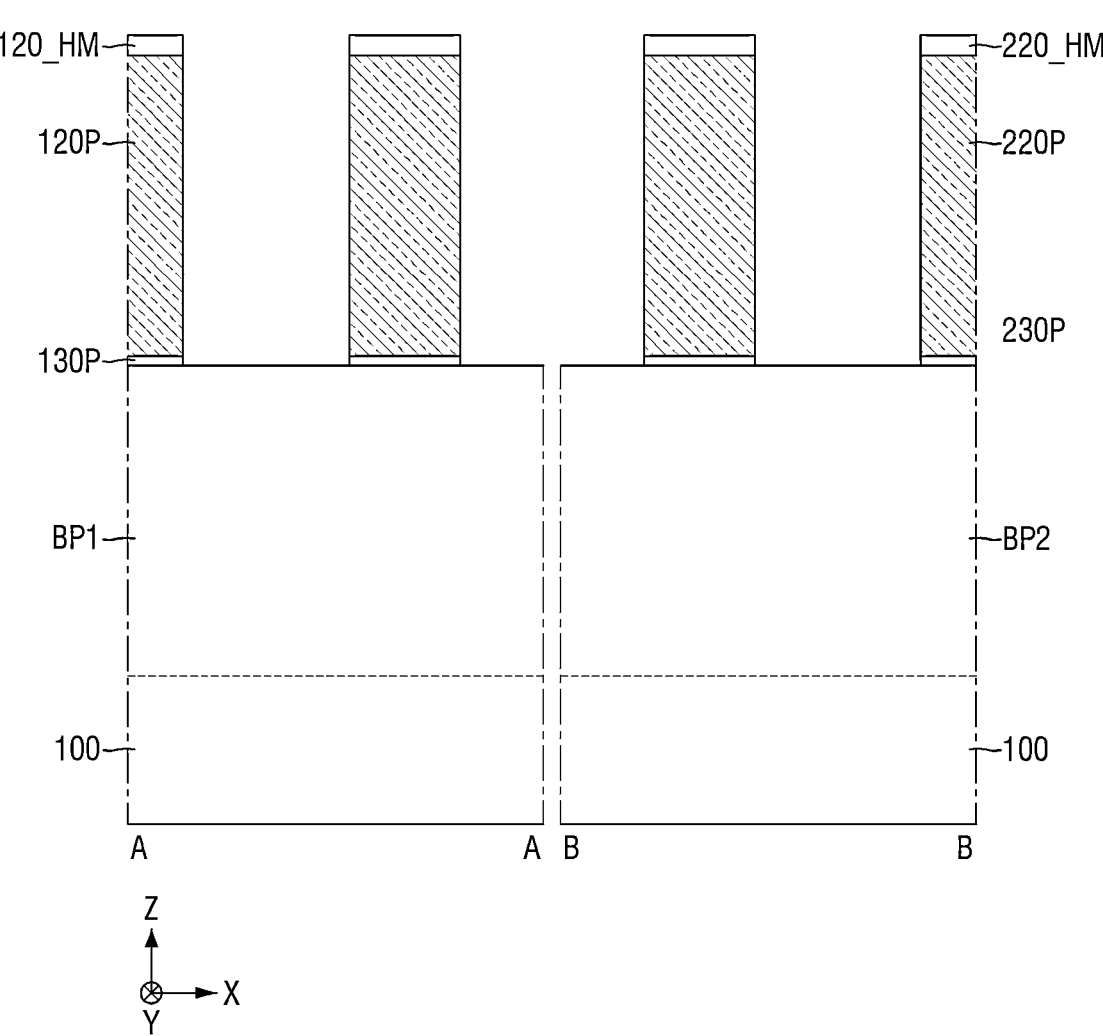
FIGS. 31 and 32 are intermediate step diagrams describing a method of fabricating a semiconductor device according to some embodiments.
Figure 32:
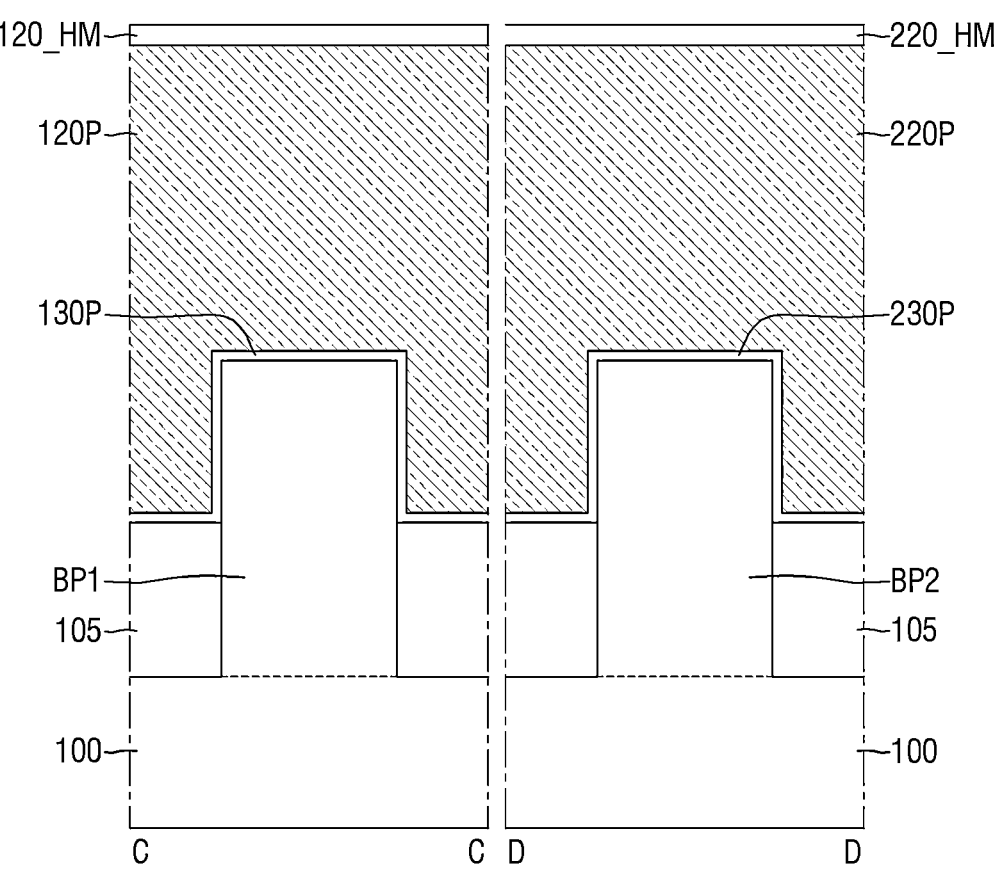

FIGS. 31 and 32 are intermediate step diagrams describing a method of fabricating a semiconductor device according to some embodiments.

Referring to FIGS. 31 and 32, the first fin-type pattern BP1 and the second fin-type pattern BP2 may be formed on the substrate 100.

Part of the first fin-type pattern BP1 and part of the second fin-type pattern BP2 protrude in the third direction Z rather than the upper surface of the field insulating film 105. The first fin-type pattern BP1 and the second fin-type pattern BP2 may be portions used as the channel region of the transistor.

The first dummy gate insulating film 130P may be formed along a profile of the first fin-type pattern BP1 protruding rather than the upper surface of the field insulating film 105. The second dummy gate insulating film 230P may be formed along a profile of the second fin-type pattern BP2 protruding rather than the upper surface of the field insulating film 105.

Subsequently, the fabricating process described by FIGS. 4 to 30 may be performed.

While some example embodiments of the present disclosure have been described above with reference to the accompanying drawings, inventive concepts may be implemented in various different forms. Those skilled in the art to which the present disclosure pertains may understand that embodiments of inventive concepts may be implemented in other specific forms without departing from the spirit and scope of inventive concepts. Therefore, it should be understood that the example embodiments described above are illustrative in all aspects and not restrictive.

What is claimed is:

1. A method for fabricating a semiconductor device, comprising:
forming a source/drain pattern on a fin-type pattern;
forming an etch stop film and an interlayer insulating film on the source/drain pattern;
forming a contact hole in the interlayer insulating film;
forming a sacrificial liner along a sidewall and a bottom surface of the contact hole, the sacrificial liner being not in contact with the source/drain pattern;
performing an ion implantation process while the sacrificial liner is present, the ion implantation process including implanting impurities into the source/drain pattern;
removing the sacrificial liner and forming a contact liner along the sidewall of the contact hole; and
forming a source/drain contact on the contact liner, the source/drain contact being connected to the source/drain pattern.

2. The method of claim 1, wherein the forming the contact liner comprises:
forming a pre-contact liner along the sidewall and the bottom surface of the contact hole; and
exposing the source/drain pattern by removing a part of the etch stop film and removing the pre-contact liner extending along the bottom surface of the contact hole.

3. The method of claim 1, wherein the removing the sacrificial liner comprises:
exposing the source/drain pattern by removing a portion of the etch stop film and the sacrificial liner extending along the bottom surface of the contact hole; and
removing the sacrificial liner extending along the sidewall of the contact hole.

4. The method of claim 1, wherein the contact liner comprises an insulating material including carbon and oxygen.

5. The method of claim 4, wherein
a concentration of carbon included in the contact liner at a first point of the contact liner differs from a concentration of carbon included in the contact liner at a second point of the contact liner, and
a height from an upper surface of the fin-type pattern to the first point is less than a height from an upper surface of the fin-type pattern to the second point.

6. The method of claim 4, wherein
a thickness of the contact liner at a first point of the contact liner is less than a thickness of the contact liner at a second point of the contact liner, and
a height from an upper surface of the fin-type pattern to the first point is less than a height from the upper surface of the fin-type pattern to the second point.

7. The method of claim 4, wherein
a thickness of the contact liner at a first point of the contact liner is equal to a thickness of the contact liner at a second point of the contact liner, and
a height from an upper surface of the fin-type pattern to the first point is less than a height from the upper surface of the fin-type pattern to the second point.

8. The method of claim 4, wherein the contact liner includes SiOC.

9. The method of claim 4, wherein a ratio of carbon to oxygen in the contact liner increases as the contact liner moves away from the source/drain contact.

10. The method of claim 1, further comprising:
forming a gate structure on the fin-type pattern before forming the contact hole,
wherein, after the forming the contact liner, the contact liner extends to an upper surface of the gate structure.

11. The method of claim 1, wherein the performing the ion implantation process comprises forming an impurity region in the source/drain pattern.

12. The method of claim 1, further comprising:
forming a plurality of sheet patterns on the fin-type pattern and connected to the source/drain pattern.

13. A method for fabricating a semiconductor device,
forming a source/drain pattern on a fin-type pattern;
forming an etch stop film and an interlayer insulating film on the source/drain pattern;
forming a contact hole in the interlayer insulating film;
forming a sacrificial liner along a sidewall and a bottom surface of the contact hole, the sacrificial liner being not in contact with the source/drain pattern;
forming an impurity region in the source/drain pattern, the forming the impurity region being performed while the sacrificial liner is present;
removing the sacrificial liner and forming a contact liner along the sidewall of the contact hole, the contact liner including silicon, oxygen and carbon; and
forming a source/drain contact on the contact liner, the source/drain contact being connected to the source/drain pattern.

14. The method of claim 13, wherein the forming the contact liner comprises exposing the impurity region by removing a portion of the etch stop film.

15. The method of claim 13, wherein the sacrificial liner includes at least one of SIN, SiC, SiCN, SiO, SiOC, or SiOCN.

16. The method of claim 13, wherein a ratio of carbon to oxygen at a first point of the contact liner is less than a ratio of carbon to oxygen at a second point of the contact liner, and a height from an upper surface of the fin-type pattern to the first point is less than a height from the upper surface of the fin-type pattern to the second point.

17. The method of claim 13, wherein a thickness of the contact liner at a first point of the contact liner is less than or equal to a thickness of the contact liner at a second point of the contact liner, and a height from an upper surface of the fin-type pattern to the first point is less than a height from the upper surface of the fin-type pattern to the second point.

18. A method for fabricating a semiconductor device, comprising:

forming a fin-type pattern and an upper pattern structure on a substrate, the upper pattern structure including a plurality of sacrificial patterns and a plurality of active patterns alternately stacked on each other;

forming a source/drain pattern in the upper pattern structure;

forming an etch stop film and an interlayer insulating film on the source/drain pattern;

forming a sheet pattern connected to the source/drain pattern, the forming the sheet pattern including removing the plurality of sacrificial patterns;

after the forming the sheet pattern, forming a contact hole in the interlayer insulating film;

forming a sacrificial liner along a sidewall and a bottom surface of the contact hole, the sacrificial liner being not in contact with the source/drain pattern;

performing an ion implantation process while the sacrificial liner is present, the ion implantation process including implanting impurities into the source/drain pattern;

removing the sacrificial liner and forming a pre-contact liner along the sidewall and the bottom surface of the contact hole, the pre-contact liner including a SiOC film;

forming a contact liner along the sidewall of the contact hole, the forming the contact liner including removing a portion of the etch stop film and the pre-contact liner; and forming a source/drain contact on the contact liner, the source/drain contact being connected to the source/drain pattern.

19. The method of claim 18, wherein a concentration of carbon included in the contact liner at a first point of the contact liner is less than or equal to a concentration of carbon included in the contact liner at a second point of the contact liner, and a height from an upper surface of the fin-type pattern to the first point is less than a height from the upper surface of the fin-type pattern to the second point.

20. The method of claim 18, wherein a thickness of the contact liner at a first point of the contact liner is less than or equal to a thickness of the contact liner at a second point of the contact liner, and a height from an upper surface of the fin-type pattern to the first point is less than a height from the upper surface of the fin-type pattern to the second point.

* * * * *